United States Patent

Cass et al.

[11] Patent Number: 5,827,797
[45] Date of Patent: Oct. 27, 1998

[54] METHOD FOR PRODUCING REFRACTORY FILAMENTS

[76] Inventors: Richard B. Cass, 24 Dutch La., Ringoes, N.J. 08551; Roland R. Loh, 1226 Pembroke Rd., Newark, Ohio 43055-1654; Thomas C. Allen, 35 Meadow Ridge, Social Circle, Ga. 30279

[21] Appl. No.: 707,170

[22] Filed: Aug. 30, 1996

Related U.S. Application Data

[63] Continuation-in-part of Ser. No. 470,291, Jun. 6, 1995, abandoned, which is a continuation-in-part of Ser. No. 197,673, Feb. 17, 1994, abandoned, which is a continuation of Ser. No. 914,996, Jul. 16, 1992, abandoned, which is a continuation of Ser. No. 580,132, Sep. 10, 1990, abandoned, which is a continuation-in-part of Ser. No. 398,895, Aug. 28, 1989, abandoned.

[51] Int. Cl.$^6$ .............................. H01L 39/24; B05B 3/00; B29C 35/02
[52] U.S. Cl. ............................ 505/430; 264/28; 264/638; 264/639
[58] Field of Search .............................. 264/28, 638, 639, 264/104, 183, 188, 189, 190, 191, 192, 193, 194, 195, 196, 197, 198; 505/430

[56] References Cited

U.S. PATENT DOCUMENTS

| | | | |
|---|---|---|---|
| 3,423,499 | 1/1969 | Ticknor | 264/188 |
| 3,431,336 | 3/1969 | Isobe et al. | 264/188 |
| 3,846,527 | 11/1974 | Winter et al. | 264/63 |
| 3,974,251 | 8/1976 | Cremer et al. | 264/194 |
| 3,992,498 | 11/1976 | Morton et al. | 264/63 |
| 4,402,899 | 9/1983 | Hartmann et al. | 264/188 |
| 4,900,710 | 2/1990 | Soukiassian et al. | 505/1 |
| 4,906,493 | 3/1990 | Laine | 427/226 |
| 4,983,573 | 1/1991 | Bolt et al. | 505/1 |
| 5,615,466 | 4/1997 | Safari et al. | 29/25.35 |

FOREIGN PATENT DOCUMENTS

| | | |
|---|---|---|
| 308812 | 12/1988 | Japan . |
| 176606 | 7/1989 | Japan . |

OTHER PUBLICATIONS

Goto et al, "Suspension Spinning of Bi–Sr–Ca–Cu–Oxide Superconductor", *Jap. J. Appl. Phys.*, vol. 27, No. 10, pp. L1845–L1847, Oct. 1988.

Goto et al. "Preparation of High–$T_c$ Y–Ba–Cu–O Superconductor Filaments by Suspension Spinning Method", *Jap. J. Appl. Phys.*, vol. 26, No. 9, pp. L1527–L1528, Sep. 1987.

Zhang, J.S. et al., "Characteristics of the Crystal Growth and Microstructures of the Y–Ba–Cu–O Compounds by Laser Floating Zone Melting Technique", Preprint from Institute of Metal Research, China.

Goto et al., "Wet Spinning . . . Superconductor", *J. of Mat. Sci. Letters*, Mar. 1988.

Beyers et al, "Annealing . . . Y, $Ba_2$, $Cu_3$, $O_{9x}$", *App. Phys. Lett.*, Aug. 1987.

Encyclopedia of Polymer Science and Technology, Plastics, Resins, Rubers, Fiber, "Enzymes to Finishing", vol. 6, pp. 543–546 (1967).

Encyclopedia of Polymer Science and Technology, Plastics, Resins, Rubbers, Fiber, "Coating to Cohesive–Energy Density", vol. 3, pp. 420–435 (1965).

(List continued on next page.)

*Primary Examiner*—Christopher A. Fiorilla
*Attorney, Agent, or Firm*—Synnestvedt & Lechner

[57] ABSTRACT

A process for producing fibers of refractory material. In one embodiment, a dispersion of particles of refractory material is prepared first. The dispersion then is mixed with a carrier solution of a salt of cellulose xanthate to form a spin mix. Using general wet spinning techniques, a filament of regenerated cellulose is formed from the spin mix. The filament has the particles dispersed therein. At this point, the filament can be utilized as a mixture of cellulose and refractory material, or it can be heat treated. If heated, the filament is raised to sufficient temperatures and over sufficient durations to remove substantially all of the regenerated cellulose and to sinter the particles of refractory material to form a filament.

48 Claims, 2 Drawing Sheets

OTHER PUBLICATIONS

Encyclopedia of Polymer Science and Technology, Plastics, Resins, Rubbers, Fiber, "Polyester Fibers to Rayon", vol. 11, pp. 813–822 (1969).

Goto et al., "Critical Current Density of $Ba_2 Y_1 Cu_3 O_{7-x}$, Superconducting Filaments Produced by Various Suspension Spinning Conditions", *J. of Mat. Research*, 3(6), pp. 1292–1296 (1988).

METHOD FOR PRODUCING REFRACTORY FILAMENTS

REFERENCE TO RELATED APPLICATION

This application is a continuation-in-part of U.S. application Ser. No. 08/470,291, filed Jun. 6, 1995, now abandoned which is a continuation-in-part of U.S. application Ser. No. 08/197,673, filed Feb. 17, 1994, now abandoned, which is a continuation of U.S. application Ser. No. 07/914,996, filed Jul. 16, 1992, now abandoned, which, in turn, is a continuation of application Ser. No. 07/580,132, filed on Sep. 10, 1990, now abandoned, which is a continuation-in-part of U.S. application Ser. No. 07/398,895, filed Aug. 28, 1989, now abandoned.

BACKGROUND OF THE INVENTION

The ability to produce refractory filaments of substantial length and useful flexibility is desirable for many applications. For example, non-superconductive fibers can be formed into electrodes for use in electrochemical processes. In a more specialized field, relatively long and flexible refractory filaments of superconductive material can be formed into wires or coils for use in electromagnetic devices.

Unfortunately, such filaments have been extremely difficult to fabricate into wire or tape shapes of the desired strength and flexibility. Previously known ceramic fiber production methods generally are problematic and material specific. Furthermore, production of superconductors is complicated by difficulties in achieving the desired critical current density.

Previously explored methods for making ceramic filaments include the following:

(1) Methods based on certain advanced ceramic forming methods, such as extrusion and tape casting. These methods typically result in a product having low mechanical strength after it is fired;

(2) Extension of the metal-working and diffusion/oxidation techniques originally developed for the low-temperature alloy superconductors, such as NbTi and $Nb_3Sn$. Typical of these processes is the so-called "powder-in-tube" process in which a high-temperature superconductive ceramic powder is packed into a silver tube. The tube is then rolled or drawn into a wire configuration. The wire generally is cracked by the tensile stress either during annealing or subsequent testing due to differences in thermal expansion between the silver sheath and the oxide core;

(3) Organic intermediary methods such as colloidal, sol-gel, and metallo-organic polymer. Each of these methods results in low-density products, due to a very low level of refractory material present in the green body, i.e., prior to heat treatment. Also, colloidal and sol-gel approaches are very slow and hence unlikely to offer commercially viable processes;

(4) Melting-solidification methods, such as melt-textured growth. These have the potential of obtaining dense, oriented crystal wire, but are inherently slow since they are limited by the dynamics of single-point crystal formation and growth;

(5) Alloy oxidation-diffusion methods. These methods have attracted attention because of the good ductility of amorphous alloy wire, and the easy control of the oxygen concentration in the material as its weight changes upon oxidation. However, the process is limited by difficulties in the mixing of immiscible Y—Ba—Cu alloy stoichiometrically.

(6) Conventional ceramic melt drawing methods. These are difficult to use due to the incongruent melting of 1-2-3 phase materials. Furthermore, the melting is not practical for high temperature ceramic.

Therefore, a need exists for a process of manufacturing ceramic fiber that provides control and flexibility over the composition and configuration of the fiber. The present invention fulfills this need.

SUMMARY OF THE INVENTION

The present invention provides a process of producing fibers of refractory material. In one embodiment, a dispersion of particles of refractory material is prepared first. The dispersion then is mixed with a carrier solution of a salt of cellulose xanthate to form a spin mix. Using general wet spinning techniques, a filament of regenerated cellulose is formed from the spin mix. The filament has the particles dispersed therein. At this point, the filament can be utilized as a mixture of cellulose and refractory material, or it can be heat treated. If heated, the filament is raised to sufficient temperatures and over sufficient durations to remove substantially all of the regenerated cellulose and to sinter the particles of refractory material to form a filament.

The present invention provides a method for producing a wide variety of refractory ceramic filaments, including both conductive and high-temperature superconductive filaments having improved properties.

The present invention also provides a method which is easy and reliable to practice, and which employs known materials and equipment that are readily available in commercial form.

The present invention further provides a method which enables continuous and fast production of high-density grain-oriented filaments with relatively high strength, flexibility, temperature capability and chemical stability. These filaments are especially well suited for use in magnet coils, motor windings, sensors, data transmission wires, electrolmagnetic sheilding, electrodes for use in electrochemical processes, and all other applications in which it is desirable to have refractory material in fibrous form.

BRIEF DESCRIPTION OF THE DRAWINGS

The features of the present invention, which are believed to be novel, are set forth with particularity in the appended claims. The invention may best be understood by reference to the following description taken in conjunction with the accompanying drawings, wherein like reference numerals identify like elements, and wherein:

DETAILED DESCRIPTION OF THE PRESENT INVENTION

Figure 2:
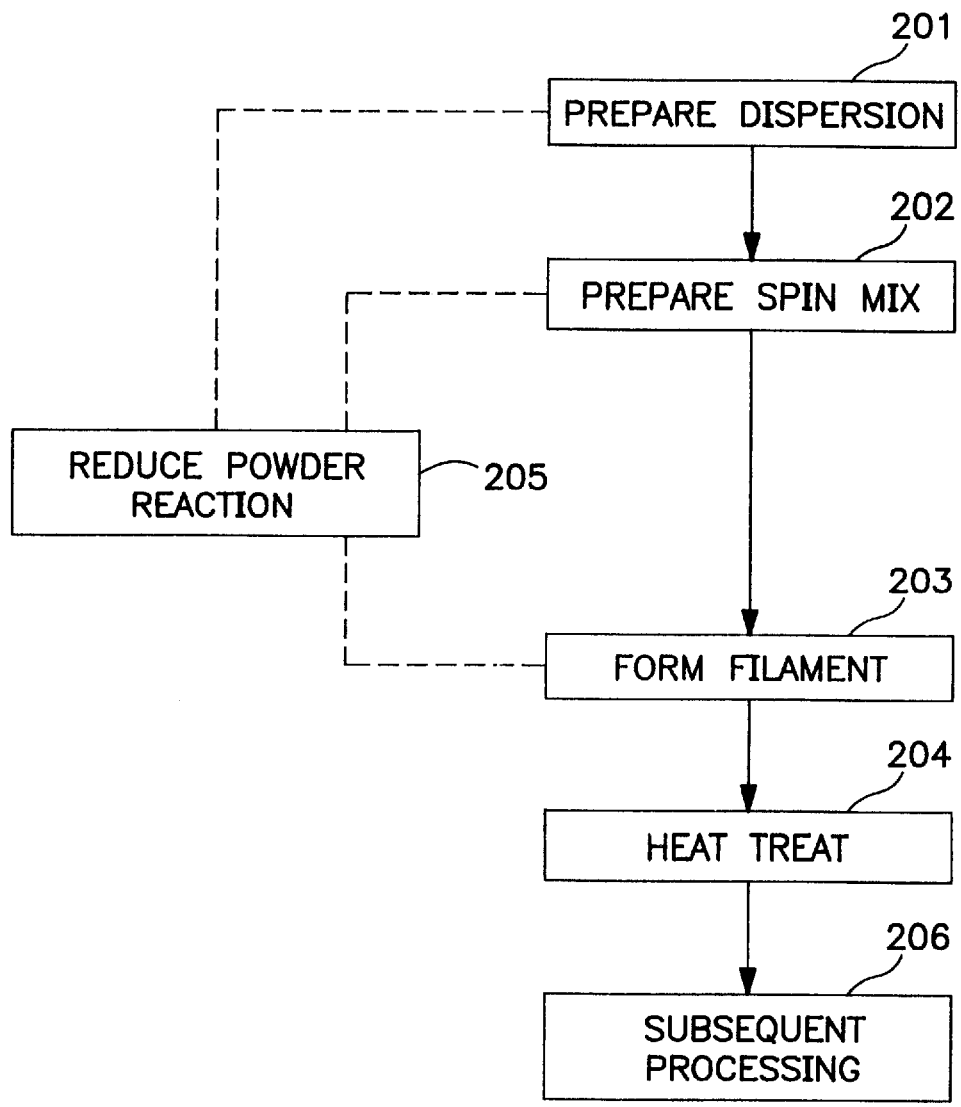
FIGS. 2 is a block diagram illustrating a possible embodiment of the process of the invention.

Referring now to the drawings, the general process is illustrated in block form in FIG. 2. Block 201 depicts the first step in which a dispersion of particles of refractory material is prepared. Aside from the dispersion medium and the refractory material, the dispersion may also contain dispersing agents and other constituents. In Block 202, the dispersion is mixed with a carrier solution or dispersion of a salt of cellulose xanthate to form a spin mix. Using wet spinning techniques, a filament of regenerated cellulose is formed from the spin mix as shown in Block 203. The cellulose filament has the powder dispersed therein. At this point, the filament can be used as a combination of refractory material and cellulose, or it can be heat treated. Block 204 depicts the optional heat treating step wherein the filament is passed through a firing furnace to pyrolize the carrier and to sinter the remaining refractory material particles to form a ceramic fiber. Through-out these steps, it is preferred that measures be taken to reduce the reaction of the refractory material with the other substances used in the process as shown in Block 205. The measures include reducing the reactivity of the refractory powder, reducing the reactivity of the other substances, and reducing the reaction time between the powder and the substances, or combinations thereof. In Block 206, subsequent processing steps are depicted which include annealing, metal impregnation, and coating. Each of these process blocks are discussed in greater detail below.

Preparation of Powder Dispersion

The process begins by preparing a dispersion of particles of refractory material. In this disclosure, the term "powder" is used interchangeably with "particles" and "refractory material particles." Furthermore, the term "dispersion" is intended to have broad meaning and is used to describe particles of refractory material dispersed, suspended, or dissolved in any manner in a liquid. The liquid or dispersion medium is usually water, but it can be nonaqueous or even a mixture of water and nonaqueous solvents. In order to avoid complications from impurities, the water should generally be deionized and/or distilled.

The powder used should be a refractory material. As used herein, the term "refractory material" means any material able to withstand the heat necessary to pyrolize the regenerated cellulose fibers without undergoing significant and irreversible undesired changes such as oxidation or melting. If the cellulose filament is heat treated, the powder should be capable of being converted to ceramic or metallic structures by sintering at temperatures above about 350° C. in oxygen, hydrogen, nitrogen or other environments. It also is desirable that the powder be able to withstand relatively high concentrations of water, acids and bases for periods of at least a few minutes to several hours or longer. Although desirable, it should be understood that by reducing the reactivity of the powder with the other substances used in the process (discussed below), this resiliency is not required. The actual powder used is dictated by the type of fiber desired. The chemistry of the powder is selected such that the fiber will have the desired properties after the powder is sintered.

Suitable non-superconducting powders include ceramic and elemental metal powders. In this disclosure, the term "ceramic" refers to oxides, nitrides, carbides, borides and silicides of metals or semi-metals and combinations thereof. Examples of such suitable materials include, but are not limited to, silicon carbide, aluminum nitride, silicon nitride, aluminum oxide, tin oxide, titanium carbide, iron silicide, hafnium oxide and zirconium oxide, titanium oxide and dioxide, molybdenum disilicide, lithium aluminate, ferrites, PZT (lead zirconium titanate), elemental metals, and any other powdered refractory material having the general properties listed above.

Titanium suboxides are among the preferred non-superconducting powders. One such suboxide is a powdered, electrically conductive substoichiometric titanium dioxide having uniformly distributed within its molecular structure chemically combined metal selected from the group consisting of chromium, copper, nickel, platinum, tantalum, zinc, magnesium, ruthenium, iridium, niobium, vanadium, tin, and combinations thereof. Another preferred titanium suboxide is a powdered, electrically conductive substoichiometric titanium dioxide having the basic formula $TiO_x$, wherein x is a number in the region of about 1.1 to about 1.95, and preferably between about 1.5 to about 1.9, and more preferably between about 1.7 to about 1.8. For solid material x should be greater than 1.5 for strength reasons. The titanium oxide may predominantly be $Ti_4O_7$ and/or $Ti_5O_9$. The bulk titanium oxide may be in coherent or particulate form, and include a range of titanium oxide compositions. Additionally, the titanium suboxide powder may have an electrocatalytically active surface. A portion of the electrocatalytically active surface may include a material selected from the group consisting of platinum group metals or alloys, platinum group metal oxides, lead and lead dioxide.

Regarding superconductive filaments, the method is applicable, but not limited, to making metal oxide superconductor such as Y—Ba—Cu—O. Other rare earth (Re) elements (except Ce, Pr, and Tb) can be used instead of yttrium to form Re—Ba—Cu—O compounds. Still other ceramic materials, for example Bi—Sr—Ca—Cu—O, may also be used, with or without doping elements such as lead, tin, and antimony. One such example is $(Bi,Pb)_2Sr_2Ca_2Cu_3O_x$. It also should be understood that the basic material from which the superconductive filaments are made need not be of the specific types enumerated above, and that other ceramic materials or even non-ceramic materials may be utilized in certain cases.

The metal oxide powder used can be either needle-shaped (tetragonal crystal structure) or spherical (orthorhombic crystal structure). The use of the needle-shaped tetragonal crystals has advantages and disadvantages, both related to physical shape. The advantage is that there will be better mechanical alignment of the crystals during the extrusion process. The disadvantage is that more carrier is required to allow easy flow during that extrusion process. It should be mentioned that the use of the non-superconductive, needle-shaped tetragonal crystal particles in the spinning process instead of the superconductive, spherical orthorhombic crystal particles does not necessarily adversely affect the superconductivity of the final product; the final annealing of the filaments ensures that the final product has the proper superconductive crystal structure. The duration of the final annealing step may be affected by the degree to which the stoichiometry of the material needs to be altered to achieve the desired superconductive crystal structure. For example, a suitable superconductive material is $YBa_2Cu_3O_{7-x}$ (e.g., SC5-P, manufactured by HiTc Superconco of Lambertville, N.J.). When x is between 0.3 and 0.5, the ceramic particles are composed of needle-shaped, tetragonal crystals which are not superconductive. When x is less than 0.2, the ceramic particles are composed of spherical, orthorhombic crystals which are superconductive. Either variety may be used. After the final annealing step, all of the material in the final product is of the superconductive structure.

The size of the particles used for superconductive and nonsuperconductive filaments plays a major role in the characteristics of the final product. Generally, the larger the particle size, the harder it is to extrude the powder/carrier spin mix in the wet spinning process, thereby requiring a higher ratio of carrier to powder. The more carrier, the more voids are left in the filaments after the carrier is removed during firing. These voids may adversely affect the current carrying capacity of the resulting filaments. On the other hand, larger particles will tend mechanically to align themselves along the filament axis during spinning to a greater degree than will smaller particles, especially the needle-shaped tetragonal crystal particles. As the degree of alignment increases so does the current carrying capacity. Thus, there are advantages and disadvantages with both large particle powders and small particle powders.

The average particle size and particle size distribution is generally limited on the high side by the size of the spinnerette hole, and by the degree of stability of the dispersion, i.e., its tendency to settle. Filtration steps are used in the filament forming process to obtain a uniform dispersion, and create a particle size distribution as low as possible. Average particle sizes can be over one hundred micrometers for larger filaments, but preferably less than forty micrometers, and more preferably less than ten microns, and even more preferably around one micrometer or less. In general, smaller particle size powders mix more uniformly and intimately with the cellulose xanthate molecules, presumably resulting in fewer voids in the sintered fiber, better fiber physical properties and other advantages. Nevertheless, too small a particle size can present other problems such as overly viscous dispersions.

The amount of refractory material in the dispersion generally should be as high as possible while maintaining a fluid dispersion to minimize the water or other liquid introduced to the process. On the hand, more fluid dispersions mix better with the cellulose xanthate solution. The levels of excess water and fluidity therefore must be balanced for the particular conditions. In general, concentrations of around 50 percent by weight of the refractory material give suitable fluid dispersions, but higher or lower concentrations can be used as necessary.

In addition to refractory powder and a dispersing medium, the dispersion usually contains dispersing agents to uniformly disperse or suspend the refractory material. These dispersing agents can be one or a mixture of any chemical which exhibits surface activity at the interface of the refractory material and the liquid. Such dispersing agents include, but are not limited to, various nonionic, anionic, cationic and amphoteric amphiphilic compounds which act as dispersants, emulsifiers, stabilizers, wetting agents, hydrotropes, coupling agents and the like. When a salt is used as a dispersing agent, that salt is usually the sodium salt, particularly when the dispersion will be mixed with a dispersion of the sodium salt of cellulose xanthate. However, other salts such as ammonium, organic amine, alkali metal and alkaline earth can be used alone or in combination as necessary. Some particularly useful dispersing agents for the refractory materials of this invention are sodium silicate; metallic salts of the various phosphoric acids; sodium polymethacrylate; sodium polyacrylate; sodium alginate; the sodium salt of copolymers of acrylic acid, methacrylic acid, maleic acid, itaconic acid and the like, with each other or with other monomers; aminopropanol, aminomethylpropanol, triethanolamine and other hydroxylalkyl amines; ethoxylated and/or propoxylated and/or alkoxylated alkyl amines, carboxylic acids, alcohols, phenols, alkyl phenols and mercaptans; ethoxylated and/or propoxylated and/or alkoxylated tristyrylphenol; ethoxylated and/or propoxylated and/or alkoxylated castor oil, sorbitan, glycerin, glucose and the like; polyethylene glycols, polypropylene glycols, and random or block copolymers of ethylene and/or propylene oxide having hydroxyl, methoxy or other capped end groups; (straight or branched chain) alkyl, alkyene, and alkene alcohols, diols and polyols and their alkyl, alkoxylate and other esters and other derivatives; phosphate and sulfate esters of the ethoxylated and propoxylated and alkoxylated adducts previously mentioned; phosphate and sulfate esters of alkyl, alkyene and alkene alcohols, diols and polyols; sodium dioctylsulfosuccinate, and other sulfosuccinates and succinamates; sodium dodecylbenzene sulfonate; sodium alpha olefin sulfonates; sulfoesters; sulfoamides; sodium alkyl naphthalene sulfonates and other aromatic and alkyl aromatic sulfonates; sodium naphthalene formaldehyde sulfonates, phosphate and sulfate esters of alkyl, alkene and alkyne alcohols, diols and polyols; fluorocarbon anionic, nonionic, cationic and amphoteric surfactants; silicone and other silicon containing anionic, nonionic, cationic and amphoteric surfactants; ether carboxylates; amine oxides; pendant amide, such as acrylamide, vinyl pyrrolidone and 2-acrylamido methyl sulfonic acid, homopolymers and copolymers; amides; alkanolamides; ethoxylated alkanolamides; alkyl pyrrolidones; amphoteric surfactants such as aminocarboxylic, sulfuric and sulfonic acids; imidazolines; quaternary amine surfactants; guar derivatives; sodium carboxmethylcellulose; hydroxyethyl and hydroxypropyl cellulose; and methyl cellulose. Ammonium, amine and other metal salts of the above dispersing agents can be used as appropriate. It is not uncommon to use several dispersing agents, each imparting their particular attributes to the dispersion, especially if the dispersion will encounter harsh demands in the process.

The dispersion can also contain other materials such as stabilizers and fiber formation modifiers, which will be discussed in more detail later. In addition, if the dispersion is to be mixed with a salt of cellulose xanthate dissolved or dispersed in water or another liquid containing excess sodium hydroxide or another base, then the dispersion may need to contain from about 0.1 to several percent by weight of sodium hydroxide or other base, depending on the concentration of the base in the cellulose xanthate solution or dispersion, to prevent coagulation or precipitation of the cellulose xanthate.

The amount of dispersing agent(s) also varies widely as necessary to achieve a good dispersion without excessive settling of the refractory material settling. Generally, about one to ten percent by weight of dispersing agent(s), based on the weight of the refractory material, are used, but lower or higher amounts can be used as necessary.

The dispersion can be prepared by different procedures, but one particularly effective procedure is to mix the refractory material with the dispersing agents and other additives in water or other dispersing liquid in a ball milling jar with nonreactive milling media and mill for a period of time. Although milling time typically is overnight, it can vary from a few minutes to several hours to several days depending on the particle size of the powder and its tendency to agglomerate and to react or interact with the dispersing liquid. The size of the jar and the number, type, shape and size of milling media depend on the milling action required and can be determined by one skilled in the art.

After the milling process, other materials may be added to the dispersion, for example, additional dispersing agents and post stabilizers. Sodium hydroxide or other base is generally added after the milling process and just prior to preparation of the spin mix, but it can be added at other times if it does not interact either chemically or physically with any of the components of the spin mix.

Preparation of Spin Mix

The next step involves mixing the dispersion of refractory material with a carrier solution or dispersion of a salt of cellulose xanthate. In this context, the term "carrier solution" is defined broadly as including solutions, dispersions, micellar dispersions, suspensions and the like. The carrier solution is commonly referred to as viscose, and typically comprises sodium cellulose xanthate dissolved in aqueous sodium hydroxide solution. Viscose provides the basis for viscose rayon fiber formation using wet spinning techniques and is well known in the art.

Reviews and descriptions of the art and viable commercial processes and reviews include: John Lundberg and Albin Turbak, "Rayon" in Kirk-Othmer Encyclopedia of Chemical Technology 3rd ed., Vol. 19, pp. 855–880, John Wiley & Sons, Inc. (1982), R. L. Mitchell; G. C. Daul, "Rayon," in Encyclopedia of Polymer Science and Technology, Vol. 11, pp. 810–847, Interscience Publishers, a division of John Wiley & Sons, Inc., (1969); Joseph W. Schappel, "Rayon" in Chemical and Process Technology Encyclopedia, pp. 969–975, (1973); and H. Peter von Bucher, "Viscose Rayon Textile Fibers," pp. 7–42 and W. J. McGarry and M. H. Priest, "Viscose Rayon Tire Yarns," in H. F. Mark, S. M. Atlas and E. Cernia eds., Man-Made Fibers, Science and Technology, Vol. 2, Interscience Publishers, a division of John Wiley & Sons, New York, 1968.) Emil Kline, "Xanthates" in Cellulose and Cellulose Derivatives, Part II, Second Edition, pp. 959–1018, Emil Ott and Harold M. Spurlin Coeditors, Volume V of High Polymers Series, Interscience Publishers, New York, 1954. It should therefore be obvious to someone skilled in the art that the present invention may be practice within the scope of the claims using a variety of different wet spinning techniques.

The following is an overview of one procedure for preparing viscose:

Wood pulp cellulose is soaked or steeped in approximately 18% by weight sodium hydroxide solution at 25 degrees C. for approximately 25 minutes and then pressed under high pressure to a pressed weight ratio of 2.6–3.0 to give an alkali cellulose which is approximately 34 wt. % cellulose, 15.3 wt. % NaOH and the remainder water. This alkali cellulose is then shredded to produce a "white crumb" which now has a more uniform distribution of sodium hydroxide. The shredding also heats the alkali crumbs to about 30° to 32° C., which is a temperature for the next step of aging. In the aging process, which decreases and controls the cellulose DP (degree of polymerization), the alkali crumbs stand in covered containers in a temperature controlled room for about 24 to 40 hours. The aged crumbs are then added to a churn where about 32 wt. % carbon disulfide is added and the temperature maintained at approximately 32° C. for about 75 to 90 minutes while the exothermic reaction to form sodium cellulose xanthate takes place. Typically only about 75% of the $CS_2$ reacts with the alkali cellulose while the remainder is consumed in forming by-product trithiocarbonate through side reactions. The xanthate crumb is then dumped into large, stirred tanks containing sodium hydroxide solution to dissolve the sodium cellulose xanthate to result in a honey-like, viscous solution called viscose. The viscose is then filtered to remove fibers and gels and then ripened so that it will coagulate readily and uniformity in spinning. During ripening, the xanthate concentration drops significantly. The xanthate groups are also redistributed more uniformly throughout the cellulose molecules. The ripening process generally takes place at about 18° C. for about 24 to 40 hours. Readiness for spinning is determined by a salt test, generally measured by the weight percentage concentration of an NaCl or other salt solution required to coagulate a drop or other quantity of viscose. The viscose now typically consists of about 9.5 wt. % cellulose, about 6 wt. % NaOH and has about 0.9 to 1.1 wt. % xanthate sulfur. During ripening, the viscose is subjected to a deaeration process, usually about 22 in. of Hg for about 12 hours or more to remove dissolved air that was introduced during the various steps of viscose preparation.

It should be understood, however, that variations of preparing viscose, especially in regard to amount, concentration, ratios, temperature and time, can be practiced within in the scope of the present invention. Additionally, other more basic various can be made. For example, salts of cellulose xanthate other than sodium can be used, excess NaOH can be eliminated from the viscose, or a non-aqueous medium can be used. The viscose may also contain other chemicals or polymers known in the art to improve fiber processing or properties, such as amines, polyglycols, hydrophilic polymers, flame retardants and the like. Moreover, the present invention is a applicable to alternative methods of producing rayon such as the lyocell process.

The refractory material dispersion and the viscose are then mixed to form the spin mix. The dispersion is usually mixed with a viscose that is ready for spinning. Next, the spin mix is subjected to filtration and deaeration processes to remove impurities and air that way have been introduced during the mixing step. However, the refractory material dispersion can be mixed with viscose immediately before spinning, just after dissolving and filtering, at some point in the ripening step, or even in the dissolving step.

The ratio of the powder to the cellulose in the viscose determines the composition of the resulting filament of cellulose containing the refractory material. If there are no losses of either material during the filament formation and purification process, then the weight ratio of refractory material to cellulose should be the same in the fiber as in the spin mix. The content of the refractory material particles in the spin mix should be greater than about 20% by weight of cellulose, and preferably over 30%, and more preferably over 50%, and optimally over 80%. A major limiting factor in the weight ratio of refractory material to cellulose is the strength of the green or organic/inorganic filaments. Another factor is the volume ratio of the refractory material to cellulose. The volume ratio can differ widely from the weight ratio due to the large difference in specific gravities of refractory materials and cellulose.

The method of mixing the powder dispersion and viscose generally should be such that the powder and cellulose xanthate molecules are intimately mixed to avoid heterogeneous domains of either material in the filaments. This involves a process of mixing particles with long polymer molecules. Although high velocity mixing generally provides for better mixing of two materials, the velocity is limited by the introduction of air into the viscose. A preferred method of preparing the spin mix is to add the selected amount of viscose to the powder dispersion of about 50% by weight of the powder dispersed in water and to stir vigorously until any color striations are no longer visible and the color is uniform. The dispersion and the viscose can also be mixed in-line through a static mixer.

The resulting spin mix is deareated by placing it under vacuum, using regular viscose preparation techniques, for as long as necessary to remove the air that was introduced during the mixing process. Additionally, it may be beneficial to filter the spin mix through fabric or other filer medium prior to spinning. A filter patch behind the spinneret is also beneficial for maintaining consistency in the filament. Seperate deaeration of the two components can also be done, especially for in-line mixers.

Fiber strength is an important consideration in the fibers of the present invention since a very high amount of non-load bearing material (i.e., refractory material) and a very low amount of load bearing material (i.e., cellulose) results in significantly lower strength than fibers of 100% cellulose. The addition of modifiers and other additives to the dispersion and viscose can improve filament strength. It generally is known that low amounts of amine and ethoxylated adduct modifiers in the viscose rayon process improve the strength of 100% cellulose fibers, but larger amounts may be harmful. In the mixed organic/inorganic fibers of the present invention, however, it suprisingly has been found that the addition of a large amount of amines, particularly amines that can also serve as dispersants and/or polyethylene oxide or similar chemicals, to the spin mix allow higher stretch, resulting in significantly higher fiber strength. These additives have been found to be particularly effective when they are incorporated into the preparation of the refractory material dispersion before it is mixed with viscose, but they can be added to the spin mix as well. The additives also are most effective when the spin mix is aged for at least several hours and even overnight. Freezing the spin mix overnight or longer, even for several days or weeks also is quite effective. This use of additives surprisingly is effective even when the viscose contains the usual amine and polyether additives used commercially, at lower concentrations, for improving the strength of 100% cellulose fibers.

Suitable modifiers or additives include, but are not limited to, 1-amino-2-propanol and its isomers such as 1-amino-3-propanol and 2-amino-1-propanol, triethanolamine, diethanolamine, monoethanolamine, ethoxylated and/or propoxylated amines, aminomorpholine, aminophenols, aminopropanediol, aminomethyl propanol, aminomethylpropanediol, diethylethanolamine, amino pyridine, 2-(2-aminoethylanino)ethanol, (2-(2-aminoethoxy) ethanol, aminoethylpropanediamine, aminomethylbutanol, aminocarboxylic, sulfuric, sulfonic and phosphoric acids, di-, tri- and tetra-amines, polyamines, copolymers of ethylene oxide and propylene oxide, polyethylene glycol, polypropylene glycol and ethoxylated, propoxylated and other alkoxylated alcohols, phenols, and acid, as well as other viscose modifiers as reported in the literature.

Particularly effective additives are 1-amino-2-propanol and polyethylene glycol with a molecular weight of about 1200 to about 1600 and preferably about 1500. These additives are effective when used separately but are particularly effective when used in combination, usually in ratios of from about 90:10 to 10:90, and preferably from about 75:25 to 25:75. The concentration of total additives can vary widely and should be at least in the range of that used in the 100% cellulose fiber art. However, these additives are particularly effective when used at concentrations of from about 2 to 10%, and preferably from about 4 to 8% by weight of the refractory material in the refractory material dispersion. For example, when the refractory material dispersion is mixed with viscose to give a ratio of 80:20 by weight refractory material to cellulose, 6% on the weight of the refractory material is 24% by weight on the weight of cellulose, far above the amount used with commercial viscose rayon fibers.

Although it is preferred to prepare a powder dispersion and mix it with viscose, filament can be obtained by dispersing the powder directly in the viscose by selection of the proper dispersing agents. In this case the dispersing agents may be blended with the powder, premixed with the viscose or a combination of the two. If the powder is not changed or destroyed in the process, it also can be added, with the necessary dispersing agents, to the alkali cellulose either before or after it is reacted with carbon disulfide but before it is dissolved or dispersed in aqueous alkali or other liquid medium. This procedure should give the best mixing of the two materials.

After deareation of the spin mix, it can now be "spun" to form filaments. If the viscose were not fully ripened or ready for spinning, the spin mix can be ripened by conventional viscose techniques to the proper "spinning" condition. The spin mix can also be frozen for a period of approximately 18 hours or longer and then thawed to a liquid for spinning. These two procedures, particularly freezing, can give better fiber formation, presumably by better mixing of the two separate dispersions and consequently the two different materials.

Filament Formation

Regenerated cellulose filaments are formed from the spin mix using wet spinning techniques. These techniques are known in the art and are referenced above. Moreover, in addition to filaments, the present invention can be practiced using other viscose processing techniques to produce films, membranes, sheets, rods and the like.

A major objective in spinning is to control coagulation versus regeneration rates and the use of the differences in these rates to optimize stretching, which aligns the cellulose molecules along the fiber axis to impart strength and other desired physical properties to the filaments. In a typical spinning process, viscose is extruded into a spin bath containing both salt and acid. The salt is at a concentration high enough so that the cellulose xanthate molecules coagulate and water is removed from the entering viscose. The concentration of acid relative to the concentration of the salt is critical in controlling the amount of water removed from the newly formed filaments before the system is rigidly fixed by the acid removing the solubilizing xanthate groups. Stretching must be balanced in these transformations. Since the viscose contains refractory material particles in the present invention, the particles become suspended and locked in the newly formed cellulose filament as these various steps occur.

Spinnerets used in wet spinning can vary widely, having nozzle holes of varying number (ranging from 1 to 20,000 or more), size (ranging from about 18 to 400 microns or more), and shape can be employed depending on the desired characteristics of the final product. Combinations of two or more spinnerets, either the same or different, in the spinbath can also be used. The shapes of the holes can vary widely to produce round, ribbon, lobate, hollow tube-like, triangular, trilobal, "Y", snowman, kidney bean or any other shape filament. The shape of the filaments in the wet spinning process, however, is dependent on other factors, such as regeneration and coagulation conditions (e.g., composition and temperature of the viscose and spinbath, spinning speed and other factors). Again, it should be understood that any known technique to affect filament shape and size may be practiced within the scope of the present invention to produce films, sheets, membranes, rods, and the like.

The spin bath, also referred to as an acid or coagulation bath, generally is aqueous, and contains both salt and acid. There are specialty situations in the literature where two baths are used, the first being a spin bath containing salt and some acid and the second being a regeneration bath containing acid and some salt. Another specialty spinning situation that has been used extensively commercially and could have advantages here is "tube spinning". It is described in the references. The most common example of a spin bath is an aqueous solution of sulfuric acid ($H_2SO_4$) and sodium sulfate salt ($Na_2SO_4$). The salt ensures that the sulfate solution behaves as a dehydrating system that removes water from the viscose. Ammonium sulfate, potassium sulfate or another salts also can be used for controlling the extent of water removal from the viscose before the filaments are made rigid by the acid. The acid removes the solubilizing xanthate groups.

To increase the strength of the filament, which is quite desirable when forming the mixed fibers of the invention, the regeneration rate can be retarded to allow much greater stretching, thereby imparting significantly higher strength to the filaments. The regeneration rate can be decreased by as much as 400 to 500% or more by the use of additives, both in the viscose and in the spinbath. The most common additive is zinc sulfate in the spinbath. In addition, hundreds of combinations of additives to the viscose and the spinbath have been investigated. Commercial systems usually use an amine, particularly dimethylamine or the ethylene oxide adduct of an alkyl amine such as cocoa amine, and polyethylene glycol, particularly of ca 1500 molecular weight or an ethylene oxide adduct of phenol or an alkyl phenol. The amines are usually added to viscose and also can be added to the spin bath. The polyether glycol can be added to viscose or the spinbath or both. The concentrations of these additives are typically less than about 5% on the weight of cellulose in the viscose and usually only from about 1% to about 2% on the weight of the spinbath when added to the spinbath.

Other factors that also lead to cellulose fibers of higher strength and modulus include using cellulose with a higher DP and purity, viscose with a higher degree of xanthation, a spinbath at lower temperature and/or with lower amounts of sulfuric acid and sodium sulfate and/or a higher amount of zinc sulfate, and spinning at a slower speed. Other regeneration and coagulation chemicals can be substituted such as phosphoric acid, hydrochloric acid, sulfonic acids and the like, mild acids such as acetic acid, citric acid, boric acid, mono or di salts of phosphoric acid, the partial salt of sulfuric acid, partial salts of organic poly acid and the like, water, neutral, acidic or alkaline inorganic or organic salt solutions, or nonaqueous compositions, such as ethylene glycol and the like.

Varying the concentrations and compositions as well as the temperature of these baths will affect the durations for which the filaments need to be exposed. The temperature of the baths can vary from ambient temperature, or cooler, to 100 degrees Celsius, or higher in the case of nonaqueous baths. It should be understood that just as one balances variables in the viscose process for pure rayon fibers, such as decreasing the acid concentration in the spinbath and/or decreasing the spinbath temperature if the viscose contains less sodium hydroxide or if the viscose has a lower salt index and is more mature, the same type of balance is required when making the ceramic fibers of this invention. However, the particular conditions are likely to be different when forming the fibers of this invention than when forming 100 percent rayon fibers. For example, the spinbath acid and possibly other component concentration usually will be lower for the fibers of this invention than for pure rayon, presumably because of dilution of the viscose. Yet this reduction in concentration may not necessarily be proportional to the dilution of the viscose.

After formation, the filaments are purified with water and other chemicals as necessary, either continuously or in a batch process, and then dried. A finish to impart lubricity to the filaments for further processing, or other chemicals to hold the filaments together for subsequent processing may also be applied to the filaments.

Heat Treatments

After being formed, the cellulose filaments with the powder dispersed therein can be heated. The heating serves to pyrolize the filaments and sinter the remaining refractory powder to produce a ceramic fiber. Prior to heating, the filaments may be formed into structures by weaving, braiding, knitting, tufting, wrapping or winding.

The techniques used for pyrolizing and sintering are known in the art. A tubular furnace or a box furnace can be used for heating the filaments. During the initial stages of firing, at temperatures around 200° C. to 600° C., the carrier is driven out of the filaments. Sintering of the refractory particles occurs at higher temperatures of about 750° C. to about 2200° C., and higher as needed, according to a standard sintering curve in air, or, on occasion, in a controlled atmosphere, e.g., hydrogen, nitrogen or argon, or in the presence of lead oxide powder. After firing, the filaments are ready for further processing.

Stabilization of Powder

Although most aspects of the viscose rayon process as used commercially or as described in the prior art may be practiced with the present invention, steps should be taken to reduce the reaction of the powder with the other substances. In this context, the term "reaction" refers to the powder's chemical or physical interaction with other substances that may diminish the desired properties of the refractory fiber. The terms "stabilization," "stabilize," and "chemically stable" refer to or otherwise concern the powder's low reactivity with another substance(s). Without such measures, many powders, especially superconductive materials or precursors, will tend to react thereby hampering the desired filament formation. For example, simply adding Y—Ba—Cu—O or similar superconductors to viscose will not produce the fibers of this invention. First, Y—Ba—Cu—O is extremely sensitive to water, presumably because of reaction or interaction. Water is very abundant in the viscose rayon process. Y—Ba—Cu—O is also quite reactive with sodium hydroxide and sulfuric acid as well as other chemicals used in the viscose rayon process. Moreover, a suspension of Y—Ba—Cu—O in water will gel essentially immediately when mixed with viscose, presumably by the reaction of barium and possibly copper with the cellulose xanthate groups to render the cellulose derivative insoluble. Therefore, different measures must be taken in order to produce Y—Ba—Cu—O and other reactive superconductive and even reactive non-superconductive fibers of this invention by the viscose rayon process.

Reducing the reaction of the powder and the other substances used in the process may be accomplished in Process Blocks 201–203 (FIG. 2) by reducing the reactivity of the powder, reducing the reactivity of the substances, replacing the reactive substances in the process, reducing the reaction time between the powder and the substances, and combinations thereof.

The refractory material may be modified either chemically or physically to protect it from the other substances. For example, this can be done by forming an organic barrier or coating around the powder particles which would be pyrolized during heating. The barrier coating forms a hydrophobic barrier around the reactive powder particles to prevent or delay reactions with cellulose xanthate, sodium hydroxide, sulfuric acid, water and other viscose rayon chemicals. Oligomers, polymers or other chemicals that may be used as barriers include, but are not limited to, ethylene, propylene and other olefin oligomers, homopolymers and copolymers; chlorinated or other halogenated or other substituted olefin oligomers, polymers and copolymers as described previously, hydrocarbon and paraffin waxes and oils; fluorocarbon polymers such as polytetrafluoroethylene, polyvinylidene fluoride, perfluorinated acrylates and methacrylates, urethanes and other polymers; polyamides; polyurethanes and other isocyanate reaction products; polyisocyanates; polyesters; polyethers; polyvinyl chloride; acrylate and methacrylate ester homo and copolymers and oligomers; condensation polymers formed by formaldehyde or other aldehyde adducts of melamine, urea, phenol, resorcinol, benzoguanamine, glycoluril and the like and combinations thereof with each other and/or other reactive polymers; acetylated and other hydrophobic esterified or otherwise modified cyclodextrins and other polysaccharides; elastomeric polymers such as butadiene, butene, isoprene, chloroprene and the like homopolymers and copolymers with reactive or unreactive end groups; ethylene-propylene copolymers and terpolymers and thermoplastic elastomers and other polymers and oligomers that will form a coating or barrier around the powder particles to protect the powder from the reactive chemicals in the fiber forming process.

It can be advantageous to incorporate into any of the polymers, copolymers, oligomers or other chemicals described above hydrophilic and/or reactive and/or interactive functional groups such as carboxylic acid, anhydride, sulfuric acid, sulfonic acid, phosphoric acid, hydroxyl hydroxymethyl, amide, hydroxymethylamide and the like. These functional groups can be end groups or can be introduced by functional monomers such as acrylic acid, maleic acid, itaconic acid, maleic anhydride, hydroxyethyl or hydroxypropyl acrylate or methacrylate, vinyl pyrrolidone, vinyl phosphate, hydrolyzed vinyl acetate, vinyl pyridine, styrene sulfonate and the like, either as comonomers or by grafting or by other methods. These functional groups can also be introduced by appropriate reaction with reactive groups in the polymer, copolymer, oligomer or other chemical. These functional groups can offer advantages such as attracting the coating or barrier compound to the inorganic compound particle surface, enhancing the adhesion of the coating or barrier compound to the inorganic compound and serving as secondary reactive sites to increase the barrier or coating effect. However, too many hydrophilic groups can be harmful once the barrier or coating is formed and allow water and/or other reactive chemicals to penetrate the barrier and react with the inorganic compounds. These hydrophilic functional groups can be rendered less hydrophilic by reactions with compounds such as zinc and other polyvalent metal salts, polyamines such as polyethyleneimine or hexamethylene diamine and the like for acid groups, acids for amine groups, alcohols polyols, acids, amides and the like for condensation type functional groups and reactive materials such as formaldehyde adducts, epoxides, isocyanates and the like for hydroxyl and amide groups.

The barrier or coating is preferably applied to the powder from a nonreactive organic solvent, preferably hydrocarbons, but also esters, amides, and even certain alcohols. The solvent can be removed or left with the powder. The coated powder then is dispersed in water, with the proper dispersants, as described previously. The amount of coating can vary from less than one percent of the weight of the powder to 50% or more, but preferably it is less than about 15%. Furthermore, it has been found that plasticizers, particularly hydrophobic plasticizers such as dioctyl adipate, dioctyl phthalate and dioctyl terephlalate and the like and more hydrophobic amphiphilic compounds enhance and maybe even extend the barrier effect, allowing less coating material to be used. In general, lower amounts of protective barrier or coating are preferred. The protective barrier or coating then is generally removed in the heat treatment process.

Yet another method of reducing the powders reactivity is by using a less reactive form of the powder. This can be accomplished by using a precursor of the desired refractory material. This precursor is then converted to the desired refractory material during the process. For example, the dispersion may comprise a raw mix of yttrium oxide, barium carbonate, and cupric oxide. During heating, the raw mix is converted to the superconductive Y—Ba—Cu—O.

Reactivity may also be lowered by modifying the dispersion and/or spin mix. In preparing the dispersion, a medium can be used that has relatively low reactivity with the refractory powder. The refractory material, for example, may be dispersed in an aqueous solution that has some type of protective action, such as an aqueous salt and/or a cheelant solution with and without certain surfactants or amphilphilic compounds. Furthermore, an inorganic compound may be added to the refractory material to stabilize it. It has been found that reactions of Y—Ba—Cu—O and similar materials are delayed significantly by suspending them in salt solutions, such as sodium, potassium and similar halide, sulfates, phosphates, acetates, citrates, EDTA (ethylene diamine tetraacetic acid) and other organic and inorganic salts. Specifically, reduced reactivity is noticed when suspending Y—Ba—Cu—O in ISOTON® or saline solution (see Example 5C&D). Another alternative is to disperse the refractory material in non-aqueous mediums such as alcohols, ketones, esters, amides, ethers, chlorinated solvents, or, more preferably, aromatic and aliphatic hydrocarbons without functional groups.

In the protective dispersing medium approach and other methods of stabilizing the reactive ceramic material, it may be necessary to consider the viscose variables and optimize that composition to the dispersion for maximum stabilization. For example, a high salt index viscose, presumably because of a higher number of sodium cellulose xanthate groups, may be more reactive with the inorganic material. Therefore, it may be advantageous to use a ripe viscose (i.e., a low salt index) with the more reactive ceramic materials.

In preparing the spin mix, a carrier solution with a relatively low reactivity with the refractory powder can be used. For example, alternative salts of cellulose can be used in the carrier solution, or excess hydroxide can be removed from the solution by ion exchange Additionally, the alkali cellulose xanthate can be dispersed in a non-aqueous medium as described above. Alternatively, viscose can be coagulated with alcohols, salts or a weak acid, or a combination of these agents, to give a reasonably stable precipitate of sodium cellulose xanthate. This precipitate can be purified, dried and then mixed with the refractory powder and redispersed in water or another liquid. Stabilizers such as aminopropanol and other additives may also be added to the spin mix, particularly if $TiO_2$ and titanium suboxides (described above) are used.

In regenerating the cellulose, a spinbath with relatively low reactivity with the refractory powder can be used. This includes using mild acids such as acetic acid, citric acid, boric acid, mono or di salts of phosphoric acid, the partial salt of sulfuric acid, partial salts of organic poly acid and the like, water, neutral, acidic or alkaline inorganic or organic salt solutions, or nonaqueous compositions, such as ethylene glycol and the like. Additionally, less reactive modifiers can be used.

Another way of reducing the powder's reaction during the regeneration stage is to reduce the reaction time or exposure. This can be done by preparing and deaerating and the viscose and the powder dispersion separately, and mixing the two in-line just before the spinneret. This technique is referred to as "injecting" and is known in the art.

Subsequent Processing

Annealing

After sintering, the ceramic fibers may be annealed using traditional annealing processes. Although not always necessary, annealing improves the mechanical and electrical properties of the fibers. Moreover, it often completes the process of transforming all of a non-superconductive tetragonal lattice in the filaments to the superconductive orthorhombic crystal structure. The filaments typically are annealed in an oxygen atmosphere. In one particular annealing process, the fiber is soaked at 950° C. for 1 to 10 hours, then cooled at 25° C./hr. to 800° C., then cooled at 5° C./hr. to 400° C., and finally at 25° C./hr. to room temperature. If any weaving or braiding of the filaments is desired, it may be performed after this annealing step.

Metal Impregnation

There are distinct advantages to impregnating the fibers with metals such as silver. The metal increases the strength and flexibility of the filaments by inhibiting crack propagation along grain boundaries, and provides very low contact resistance and lower overall resistivity at temperatures above the superconductive critical temperature. The metal, particularly silver, also improves stability by protecting the ceramic crystals from contamination and atmospheric attack, promotes grain growth and alignment of superconductive crystals, and cleans the grain boundaries of contaminants such as barium carbonate, thereby increasing current carrying capacity.

As to superconductors specifically, metal impregnation, particularly silver, improves not only the superconductive properties, but also the production process. The region of superconductivity extends into the silver itself, which makes possible continuous conductivity across connections between superconductive filaments. Silver also acts as a coolant media for heat transfer from the ceramic material to the coolant during superconducting implementations. Additionally, silver typically includes at least some silver oxide, which provides additional oxygen to the ceramic material during the final annealing process. It is during this step that the stoichiometry of the crystalline structure is changed from the non-superconductive tetragonal phase to the superconductive orthorhombic phase. The advantages to performing silver impregnation (and metal impregnation in general) exist for the treatment of all superconductive filaments, and not just those produced under the specific conditions described in the manufacturing procedure presented herein.

Coating

In lieu of or in addition to metal impregnation, a coating can be applied to the filaments to provide superior environmental stability. Suitable coatings include polymers such as textile sizing agents, including but not limited to polyvinyl alcohol, starch and starch derivatives cellulose esters, esters and other derivatives, acrylic and methacrylic acid and ester homopolymers and copolymers, polyesters with hydrophilic groups such as sulfonic acid and polyethylene oxide and the like, other polymers such as polyurethanes, polyamides, polyesters and the like. This coating should be applied after the final annealing step.

Schematic Example of Process

Figure 1:
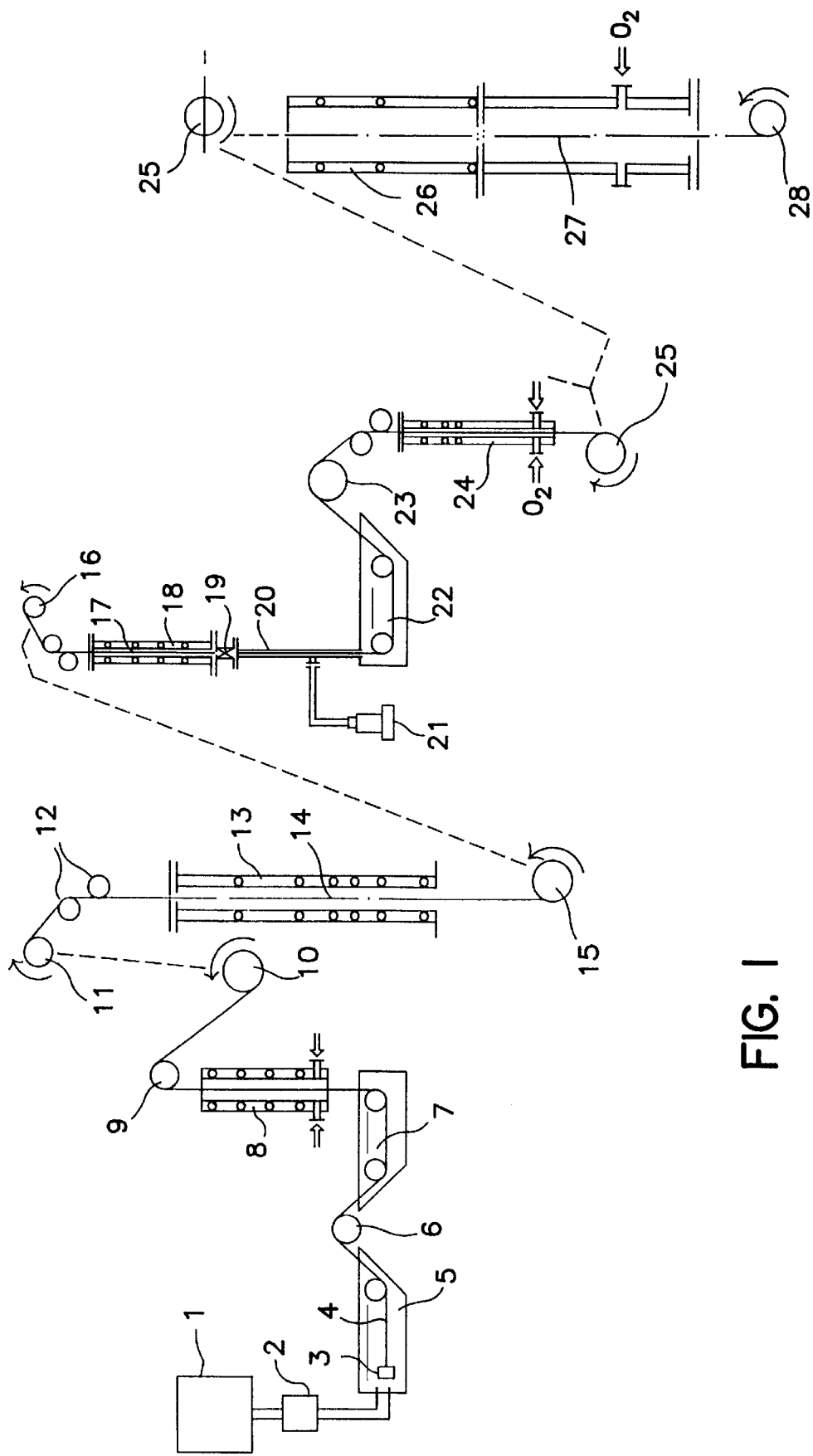
FIG. 1 is a schematic diagram of one preferred embodiment of the invention using a wet spinning technique.

Referring now to the schematic depiction of the process, without thereby limiting the scope of the invention, FIG. 1 shows one preferred embodiment of the process for use in manufacturing high temperature ceramic superconductive filaments. Cellulose saturated with a base is reacted with carbon disulfide in reactor 1 to form sodium cellulose xanthate. The cellulose xanthate derivative is then dissolved in aqueous sodium hydroxide or another aqueous base to form a viscous solution or dispersion commonly called viscose. A dispersion of refractory material particles is mixed with the viscose.

This mixture is pumped by a metering pump (2) through a spinneret 3 directly into a spin bath (5) also known as the acid bath or spinbath at a rate of about 1 to 50 meters per minute or higher. The spinneret (3) comprises, in this example, a nozzle with 750 holes, each 80 microns in diameter. However the number, size, shape and distribution of the holes in the spinneret and the number, size and shape of the spinneret(s) can vary widely, depending on the specific conditions. A draw godet roll (6) pulls on the filaments (4) to draw the spun fiber through the spin bath. The bundle of parallel filaments 4 stays in the spin bath (5) for a period of from 1 second to about 3 minutes (or longer), and then goes through a second hot aqueous acid bath at temperatures generally around 90 degrees Celsius to complete regeneration. The filaments are then purified with water and other chemicals as necessary (7), either continuously or in a batch process and dried (8). A finish to impart lubricity to the filaments for further processing or other chemicals may be applied to the filaments before they are wound onto a package (10) for subsequent processing. After passing through a dryer (8) to evaporate the water, the dried rayon cellulose-ceramic composite filaments (4) are fed over a drawing element (9) and wound onto a take-up reel (10) to await further processing.

The take-up reel (10) wound with filaments can be transported and used as the feed reel (11) for the pyrolizing and sintering step or subsequent weaving, braiding, tufting or winding prior to sintering. The filaments (14) are unwound from the feed reel (11) past the drawing elements (12) into the firing furnace (13). Alternatively, furnace (13) can be a periodic furnace or a tubular one. During the initial stages of firing, at temperatures around 200° C. to 400° C., the carrier is driven out of the filaments (14). Sintering of the ceramic particles occurs lower in the furnace, at higher temperatures of about 750° C. to 1250° C. depending upon the type of refractory powder (e.g., superconductive/non-superconductive). After firing, the filaments (14) are wound onto a second take-up reel (15) to await further processing.

The take-up reel (15) becomes the feed reel (16) for the next step of processing, which may be metal or other in filling material impregnation, or annealing. In annealing, the filaments (27) are fed from the reel (25) into the annealing furnace (26), where the filaments (37) are annealed. When producing superconducting filaments, this annealing completes the process of transforming all of the non-superconductive tetragonal lattice in the filaments to the superconductive orthorhombic crystal structure. The superconductive filaments (27) are then wound onto a take-up reel (28) for storage. If any weaving or braiding of the filaments is desired, it may be performed anytime after this annealing step.

In metal impregnation, the filaments (17) are preheated in the pre-heating furnace (18) at temperatures around 600° C. to 2200° C., and then passed through the line guider (19) into a rough vacuum chamber (20) (mechanically pumped by pump (21) to a pressure of a few torr) to remove the air from the pores in the sintered filaments and thereby make room for in fill solution (e.g., silver or other metal solution) to enter the pores. Since the unsintered fibers are inherently porous, a similar in filling can be performed on unsintered filaments to impart different pre-sinter or post-sinter properties to the fiber. The pre-heating in the pre-heating furnace (18) is not essential; however, pre-heating should be used if metal impregnation is performed on filaments that have not previously been fired to remove the carrier material.

To apply a silver coating, the filaments (17) are then passed through a room-temperature bath (22) containing a metallo-organic solution of 8% to 30% by weight Ag concentration for from about 6 minutes to about 1 hour. One possible solution is prepared by mixing Flexible Silver Coating SC4005 (produced by the Engelhard Corporation of Edison, N.J.) with Thinner SC9025 (also produced by Engelhard). After the filaments have passed through the bath, the silver solution has filled the pores and coated the surfaces and grain boundaries of the filaments (17).

The thickness of the silver layer can be controlled by changing such parameters as the silver concentration of the solution, the viscosity of the solution, and the duration for which the filaments are exposed to the solution. The greater the silver concentration, the thicker the silver layers. The more viscous the solution, the slower the impregnation and the longer the duration of exposure of the filaments in the solution required to achieve satisfactory impregnation. The greater the concentration of thinner, the less viscous the silver solution, the faster the impregnation. The longer the exposure of the filaments in the solution, the greater the thickness of the silver layer.

The filaments (17) are then drawn over the take-up godet (23) into the oxygen-filled post-heating furnace (24) in which temperatures of from 450° C. to 750° C. are maintained to drive off all of the metallo-organic solution except the silver. The filaments (17) are wound onto a take-up reel (25) to await further processing.

The metal impregnation (items 16 to 25 of FIG. 1) also can be performed in alternative ways. Instead of a metallo-organic solution, a AgNO$_3$/EDTA aqueous ammonia solution could be employed. Silver is not the only metal which can be used either; metals such as gold, indium, lead, or tin could used instead. Depending on the application, impregnation with metals of low melting point or high thermal and electrical conductivity may be desired.

Metal impregnation (items 16 to 25 of FIG. 1) is optional. If silver impregnation is omitted, such a procedure would start with powder suspension preparation, followed by spinning and pyrolizing/sintering, and then proceed directly to annealing. Consequently, items 16 to 25 of FIG. 1 can be eliminated and the firing furnace (13) can be combined with the annealing furnace (26).

Each of the processing steps generally described above concludes with the filaments being wound onto a take-up reel to await further processing. The primary reason for this step is the general incompatibility of consecutive steps in the manufacturing process, primarily due to the different rates at which the filaments can be fed during the different processing steps. The collection of filaments onto a take-up reel can be omitted anytime it becomes practical and more efficient to combine two consecutive steps into one continuous step. Thus, in many cases, it is possible to create one continuous process for the manufacture of refractory filaments.

Referring to FIG. 1, the winding of the filaments (4) onto the take-up reel (10) at the end of wet spinning and the subsequent unwinding of the filaments (14) from the feed reel (11) at the beginning of pyrolizing and sintering can be eliminated, if the rate of filament spinning and the rate of travel of the filaments through the firing furnace are the same. Under similar conditions, the take-up reel (15) at the end of pyrolizing and sintering and the feed reel (16) at the beginning of silver impregnation can be eliminated. This will create the possibility of combining the firing furnace (13) and the pre-heating furnace (18) into a single furnace with varying temperature along its length. Similarly, the post-heating furnace (24) at the end of silver impregnation can be combined with the annealing furnace (26).

The detailed example described immediately above is just one possible procedure for making one type of superconductive ceramic fiber. Many of the steps in the procedure can be implemented in alternative ways which may prove advantageous for the particular application or result desired.

Product from Process

The process described above produces both superconductive and non-superconductive refractory material fibers. The refractory material fibers produced from this method, sintered or not, find numerous applications in the electrochemical, electromagnetic or electrorestrictive fields. The fiber can be used as continuous filament, as a woven, felted or tufted mat, as chopped filament sections, and even as a "green" fiber wherein the cellulose is not pyrolized and remains in the fiber.

Conducting fibers such as titanium suboxides (described above) are useful as electrodes, sensors, and electromagnetic shielding. Additionally, conductive ceramic fibers act as current path enhancers therefore making them particularly well suited for light weight active material supports in alkaline and solid sate batteries. On a larger scale, the fibers can also facilitate large ceramic electrodes for use in chrome plating, aluminum/magnesium recovery, electrochlorination, and other electrochemical processes. PZT fibers are particularly useful in sensing and actuating application such as vibration dampening, noise reduction, etc. Molybdenum disilicide fibers are useful as high temperature conductors and reinforcements. Lithium aluminate ceramic fibers are useful in carbonate-based fuel cells. In its "green" state, tin oxide fibers can be woven into fabric and floor coverings to reduce static electricity. Indeed, conductive fibers produced from this process are useful in any application where a material's resistance to corrosion and/or high temperature is important along with its electrical conductivity and light weight.

The present invention also provides for the manufacture of superconductor filament. Generally, it is preferable to produce a superconductor to achieve as high a current carrying capacity and as high a critical temperature as possible. In particular, it is preferable to produce superconductive fibers having critical temperatures of 90 K or higher, critical current densities of over 1,000 A/cm$^2$, and preferably over 7,500 A/cm$^2$, and more preferably over 10,000 A/cm$^2$ at 77 K, and tensile strengths of 6,500 psi or greater. The applications for superconductors abound and include wires cables, sensors, electronicmagnetic devices, and connectors in cryogenic applications. As with conductive fibers, superconductive fibers produced from this process are useful in any application where a material's resistance to corrosion and/or high temperature is important along with its electrical conductivity and light weight.

EXAMPLES

Example 1

Production of a conductive titanium oxide ceramic fiber 1.75 grams of cupric chloride intercalated graphite was added to 50 grams of $TiO_2$ from Tioxide Ltd., England, mean particle size approximately one micrometer to introduce 0.72% cupric chloride into the structure of the titania after heat processing. The graphite was burned out per the procedures of U.S. Pat. No. 4,931,213. 50 grams of deionized water containing 3% by weight of D,L-1-amino-2-propanol dispersant Aldrich Chemical, catalog #11,024-8 were added to the resulting mixture and the combination ball milled for 16 hours using balls having a diameter of 0.5 to 2.5 inches to reduce/eliminate agglomerates. Approximately two milliliters of 1N NaOH solution was pipetted into the milled mixture to raise the pH into the 11.0 to 12.0 range. Approximately 116 cubic centimeters (132 grams) of viscose was added to the mixture, containing 9.45% by weight of cellulose, 6.10% by weight unreacted NaOH, and 32% carbon disulfide by weight on the weight of cellulose, reacted with sodium hydroxide and the cellulose. This mixture was stirred for approximately one-half hour in a an ice bath at approximately 3° C. to avoid adding significant energy to the chemically unstable viscose. A high shear mixer was used in order to mix the components, to break up agglomerates and to further eliminate agglomerates. The stirred mixture then was filtered through a 25–40 micrometer cloth under <10 psi air pressure, then stored in a refrigerator for one hour at 10° C. to deaerate the mixture and then allowed to equilibrate just before spinning at 18° C.

The ceramic/viscose mixture was fed into a spinning machine through an enclosed and air pressured chamber feeding a constant pressure, variable volume "Zenith" metering pump. The pump forced the mixture through a conventional rayon spinnerette containing 100 round, of 89 micrometer diameter into a 43° C. coagulation and regeneration bath spinbath, flowing gently countercurrent to the discharging precursor, composed of 7.5% by weight of sulfuric acid ($H_2SO_4$), and 22.0% by weight of sodium sulfate ($Na_2SO_4$), with the remainder being deionized water. As in conventional viscose rayon technology, the sodium cellulose xanthate portion of the precursor first coagulated and precipitated, encapsulating the suspended inorganic compound, in the high salt spinbath and then reacted with the spinbath acid and regenerated the cellulose xanthate to cellulose to form approximately 20% by weight of cellulose and approximately 80% by weight of ceramic. Precursor was fed into the spin bath at a rate of approximately 16.0 grams per minute, and the spun fiber was drawn away from the spinnerette face by a take-up godet operating at a linear speed of approximately 6.0 meters per minute.

The fibers were pulled from the first take-up godet by a second, faster paced godet, operating at a linear speed of approximately 7.0 meters per minute, thereby applying a 17.5% extension to the fiber to align both the rayon molecules and the ceramic particles along the longitudinal axis of the fiber. In its passage from first to second godet, the fiber was immersed in a boiling deionized water bath. This bath, continued the regeneration process started in the spinbath and began a cleansing/washing process. The fibers were wound continuously on a take up reel moving at the same linear speed as the second godet.

The fibers were cleaned of sulfuric acid residue and other impurities by dipping the fibers, cut from the take up reel into 6 inch lengths, into two consecutive clean 95° C. deionized water baths for two minutes each. The fibers were then allowed to air dry for approximately 24 hours. The diameters of the dried fibers were approximately 25 $\mu$m as determined using the micrometer scale on an Olympus microscope.

The dried fibers were then filled with titanium isopropoxide by submersion for 5 minutes in a solution of titanium isopropoxide (containing 33% by weight titanium dioxide) in ethanol, followed by heating at 110° C. to drive off the ethanol solvent. The immersion and heating steps were conducted a total of three times (i.e., repeated twice). Then the fibers were heat-treated as follows. In stage one, the fibers were heated in air to 1100° C. by slowly increasing the temperature (60° C./hour) in the furnace. As the temperature reached approximately 400° C., the rayon component of the fiber burned off as carbon dioxide ($CO_2$) and water. In the second stage, the now inorganic fiber was heated to 1080° C. with Argon gas being fed into the furnace, and when the temperature reached 1100° C., hydrogen was fed to the furnace and the heating rate was increased to 85° C./hour until the furnace temperature was 1200° C. After remaining at 1200° C. for approximately one hour to sinter the ceramic particles, in the third stage, the fibers were cooled at the rate of 100° C./hour until the temperature reached approximately 1000° C., and thereafter cooled more gradually at the rate of 60° C./hour until they returned to ambient temperature.

Visual inspection revealed distinct fibers which retained their individual character in mild handling. Fiber length after firing was approximately 3 inches, the diameter was approximately 15 micrometer and the strength appeared to be approximately 138 MPa as measured by the bending test method. Reduction in hydrogen at 1200° C. for one hour created conductivity through the presence of both the sub-oxide cupric oxide and the sub-oxide titania, as described in U.S. Pat. No. 4,931,213.

Example 1A/2

Production of a conductive titanium oxide ceramic fiber 2.7 grams of cupric chloride intercalated graphite was added to 77.3 grams of $TiO_2$ from Diamond Metals, Japan, with a mean particle size of approximately 0.5 micrometers to introduce 0.72% cupric chloride into the structure of the titania after heat processing. The graphite was burned out at 800° C. for 2 hours. 160.0 grams of this modified titanium dioxide powder was added slowly to the vortex of a solution, stirred in a beaker on a magnetic stirrer, of 2.4 grams of a 30% aqueous solution of sodium polymethacrylate of an average molecular weight of about 10,000 (Colloid™ 225 from Rhône-Poulenc Surfactants and Specialties), 2.4 grams of a 90% powder of sodium methyl-naphthalene formaldehyde sulfonate (Supragil™ MNS/90 from Rhône-Poulenc Surfactants and Specialties), 1.6 grams of DL-1-amino-2-propanol and 3.2 grams of polyethylene glycol of an average molecular weight of approximately 1300 to 1600 (Carbowax® PEG 1450 from Union Carbide Corporation) plus 150.4 grams of water, deionized by passing through an ion exchange resin. The Colloid™ 225 and Supragil MNS/90 served as dispersants for the modified titanium dioxide. After all the modified titanium dioxide was added to the aqueous solution, the thick dispersion was stirred by hand to give a less thick pasty dispersion. This dispersion was added to a porcelain milling jar having a capacity of approximately one liter of water containing approximately 35 alumina balls having various diameters ranging from 0.5 to 2.5 inches. The jar was then sealed with a cap and a clamp. This combination was ball milled overnight for approximately 18 hours to reduce/eliminate agglomerates. The dispersion was then thin and uniform. Next, 5.0 grams of 1N NaOH solution was added to 143.1 grams of this dispersion and mixed well to provide sufficient alkalinity to the dispersion to prevent "shock" or polymer precipitation upon mixing with the highly alkaline viscose. To this mixture was added 189.3 grams of "viscose", or a solution of sodium cellulose xanthate, or cellulose sodium dithiocarbonate in aqueous sodium hydroxide. This particular viscose solution contained approximately 9.45% by weight of cellulose with a DP of approximately 400. Therefore, the weight ratio of modified titanium dioxide to cellulose was approximately 83.5:16.5. The particular viscose used was a commercial viscose with a starting composition by weight of 9.45% cellulose and 6.10% NaOH based on the aqueous solution and 32 wt. percent carbon disulfide based on cellulose (boc). This viscose had been aged by conventional procedures to a salt index (sodium chloride coagulation) of approximately 4 to 5.

The ceramic dispersion—viscose mixture, or spin mix, was stirred vigorously by hand with a wide plastic spatula after each addition of four increments of the viscose to the inorganic dispersion. The final mixture was then stirred vigorously by hand with the same spatula for approximately 15 minutes at ambient temperature. The stirred mixture then was filtered through grams of the above spinbath solution, and passed around a godet at 40 RPM (linear speed of 6.1 m/min.), into a hot bath containing approximately 2.5% by weight $H_2SO_4$ at approximately 95° C., over a second godet at 66 RPM (a linear speed of 10 m/min.) to give a godet stretch of approximately 65%. The filaments were then wound onto a paper tube purified, removed from the paper tube and converted into inorganic fibers by heating to at a rate of 60° C. per hour. At 1080° C. argon was introduced, followed by hydrogen at 1100° C. The heating rate was then increased to 85° C. per hour (remped @85° C. per hr. and held at 1230° C. for 2.5 hrs. (2.5 hr. soak), then cooled at the rate of 100° C. per hr. to ambient temperature. The fiber had a resistivity of 0.53 Ω cm.

Example 1B

Production of a conductive titanium oxide ceramic fiber
Example 1A was repeated except that the dispersant system consisted only of 2.4 grams of 1-amino-2-propanol and 2.4 grams of Colloid™ 225 and 75.2 grams of deionized water with 80.0 grams of modified titanium dioxide. The ratio of inorganic compound to cellulose was 80:20 by weiaht. The viscose had a sodium chloride salt index of approximately 7.5. The spin mix was not frozen but was spun in about 4 hours on the same day it was mixed. The spinbath composition was approximately 7.55 wt. % H2SO4, 22.85 wt. % Na2SO4 and 1.5 wt. % ZnSO4 at a temperature of approximately 43° C. The second bath contained approximately 2.5 wt.9e H2SO4. This unfrozen spin mix gave poor spinning. A maximum stretch of only about 32.5%, corresponding to a second godet speed of approximately 53 RPM, was obtained. The zinc sulfate concentration in the spin bath was increased to 2.5 wt. %, with the sulfuric acid and sodium sulfate concentrations now at approximately 7.50 and 22.0 weight percent respectively. The sulfuric acid in the hot second bath was approximately 2.0 wt. %. The spinning (fiber formation) was significantly improved and the maximum godet stretch obtained was about 62.5%, corresponding to a second godet speed of 65 RPM. The filaments were then wound, purified, and converted into inorganic fibers by the same procedure as in Example 1A.

Example 1C-1

Production of a conductive titanium oxide ceramic fiber

Example 1A was repeated except that the modified titanium dioxide was made by adding 5.25 parts of cupric chloride intercalated graphite was added to 50 parts of a mixture of 75% by weight of $TiO_2$ from Diamond Metals, Japan, with a mean particle size of approximately 0.5 micrometers and 25% by weight of Heavy Grade $TiO_2$ from TAM Ceramics Inc. having an average particle size of 2–3 micrometers and mixed in a V-blender for 2 hours to introduce 2.16% cupric chloride into the structure of the titania after heat processing. The graphite was burned out at 800° C. for 2 hours. 100 grams of this higher copper mixed particle size powder was added to a solution of 1.5 grams of Colloid™ 225, 1.5 grams of Supragil™ MNS/90, 1.0 g 1-amino-2-propanol and 2.0 g Carbowax® PEG 1450 in 94.0 grams of deionized water. This dispersion was milled over a week end (Friday to Monday). Then, after the addition 5.0 grams of 1N NaOH, the dispersion was added to viscose containing approximately 7.75% by weight cellulose and approximately 5.69% by weight sodium hydroxide at a sodium chloride salt index of approximately 5 to 6. The titanium dioxide dispersion was mixed with the viscose to give a spin mix of approximately 83.5 to 16.5 weight ratio of modified titanium dioxide to cellulose. The spin mix was frozen over night, thawed and spun as in Example 1 into a spinbath of approximately 7.0 wt. % $H_2SO_4$, 22.0 wt. % $Na_2SO_4$ and 1.5 wt. % $ZnSO_4$ at approximately 45 degrees C. The maximum stretch obtained was approximately 47.5%, corresponding to a second godet speed of approximately 59 RPM.

Example 1C-2

Production of a conductive titanium oxide ceramic fiber

A change of the spinbath composition from Example 1C-1 to approximately 7.3 wt. % $H_2SO_4$, 20.6 wt. % $Na_2SO_4$ and 3.3 wt. % $ZnSO_4$ produced a maximum stretch of approximately 57.5%, corresponding to a second godet speed of approximately 63 RPM.

Example 1D-1

Production of a conductive titanium oxide ceramic fiber

Example 1A was repeated except that 100 grams of the modified titanium dioxide as in Example 1-C-1 was added to a solution of 1.5 grams of Colloid™ 225, 1.5 grams of Supragil MNS/90 in 97.0 grams of deionized water. This dispersion was milled over night and mixed with an industrial yarn viscose containing approximately 7.35% by weight cellulose and approximately 5.60% by weight sodium hydroxide and containing amine, ethoxylated amine and polyethylene oxide modifiers at a total concentration of less than 2.5% based on the weight of the cellulose. After adding 5.0 grams of 1N NaOH to the modified titanium dioxide dispersion, it was mixed with the viscose so as to give a spin mix of approximately 80 to 20 weight ratio of modified titanium dioxide to cellulose. The spin mix was frozen for approximately 20 hours, thawed at ambient temperature and spun as in Example 1 but at a rate of 8 g/min. into a spinbath of approximately 4.0 wt. % $H_2SO_4$, 13.5 wt. % $Na_2SO_4$ and 4.25 wt. % $ZnSO_4$ at approximately 35 degrees C. and a second bath of approximately 2% $H_2SO_4$ at a temperature of approximately 95 degrees C. The maximum stretch obtained was approximately 102.5%, corresponding to a first godet speed of approximately 40 RPM and a second godet speed of approximately 81 RPM. The filaments were then wound onto a paper tube, removed from the tube, purified, and converted into inorganic fibers as in Example 1.

Example 1D-2

Production of a conductive titanium oxide ceramic fiber

Example 1D-1 was repeated except that 75 grams of the modified titanium dioxide was added to a solution of 1.125 grams of Colloid™ 225, 1.125 grams of Supragil MNS/90, 1.125 grams of 1-amino-2-propanol and 1.5 grams of Carbowax PEG 1450 in 70.5 grams of deionized water. This dispersion was milled over night and then mixed with the same industrial yarn viscose as in Example 1D-1 in the same manner and the same ratios. The spin mix was frozen for six days, thawed and spun as in Example 1D-1 but at a first godet speed of 15 RPM into a spinbath of approximately 4.0 wt. % $H_2SO_4$, 13.5 wt. % $Na_2SO_4$ and 4.25 wt. % $ZnSO_4$ at approximately 36° C. and a second bath of approximately 6.22% $H_2SO_4$ at a temperature of approximately 95° C. The maximum stretch obtained was approximately 128%, a second godet speed of approximately 41 RPM. The filaments were then wound onto a paper tube, removed from the tube, purified, and converted into inorganic fibers as in Example 1.

Example 1E

Production of a conductive titanium oxide ceramic fiber 6.48 parts by weight of a solution of 33% by weight of cupric chloride dihydrate (CuCl2 2H2O) were added to 1.5 parts by weight of Supragi MNS/90, 1.5 parts by weight of Colloid 225 and 1.0 parts by weight of D,L-amini-2-propanol and then mixed with 100.0 parts of the titanium dioxide as in Example 1A in a plastic jar containing alumina media. This mixture was milled overnight for approximately 18–20 hours to give an uniform dispersion. This dispersion was then spray dried in an Anhydro brand spray dryer, using a 2 fluid nozzle, at an air temperature of approximately 600° F. and an air column height of approximately 10 feet. The resulting powder was then "burned out" at approximately 500° C. for approximately 2 hours.

300 grams of the TiO2 CuCl2 spray powder was added to a solution of 4.5 grams of Supragil MNS/90, 4.5 grams of Colloid 225 and 3.0 grams of 1-amino-2-propanol and 128.6 grams of deionized water in a porcelain jar with 35 to 50 mixed size alumina media and ball milled overnight. The next morning, 159.0 grams of deionized water was added to the thick dispersion and the mixture was milled for an additional one hour. 701.0 grams of a high strength, wet modulus viscose containing approximately 7.35% by weight cellulose and 5.60% by weight sodium hydroxide was added to 589 grams of the $TiO_2$ $CuCl_2$ dispersion to which 15 grams of a 1N NaOH solution had been added to give a spin mix 21 with a weight ratio of 85:15 $TiO_2$ $CuCl_2$:cellulose. This spin mix was mixed thoroughly with a spatula and filtered and deaired as in Example 1A except a 20 to 25 um filter paper was used. The spin mix was then frozen over night, thawed and converted into fiber as in Example 1A except the spinneret was a conventional rayon spinneret containing 790 holes at a diameter of 88.9 um and the pump speed of the spin mix was 35.4 grams per minute. The immersion of the filaments in the spinbath was approximately 30 cm. and the spinbath, which was composed of approximately 4.5% $H_2SO_4$, 16.4% $Na_2SO_4$, and 3.2% $ZnSO_4$ by weight at a temperature of about 40 degrees Celsius had a volume of approximately 20 liters, replenished from a reservoir of approximately 18.4 gallons with a flow of about 1 gallon per minute countercurrent to the direction of the filaments. The initial spinning gave rather poor spinning with a condition known as clubbing where globules of ungenerated viscose coats the filaments intermittently. An additional 100 ml of conc. (~96%) H2SO4 was added to the spinbath to give a new composition of approx. 4.69% $H_2SO_4$, 16.4% $Na_2SO_4$ & 3.21% $ZnSO_4$. The clubbing disappeared. The filaments emerged from the spinbath and were wrapped three times around two godets of 0.628 meters circumference each, both rotating clockwise at 22.7 RPM and then into a hot second bath of approximately 2.0% $H_2SO_4$ solution at approximately 55° C. with an immersion length of approximately 25 cm. The filaments emerged from this hot second bath and were wrapped approximately 26 times around a wash drum of approximately 0.840 meters circumference rotating clockwise at a speed of approximately 27.1 RPM. While around this drum, the filaments were washed with deionized water at approximately 60° C. falling on the filaments from holes in two tubes suspended above the wash drum. The filaments then left the wash drum to be wrapped about 15 times around a dryer drum of 0.678 meters circumference rotating clockwise at a speed of approximately 31.8 RPM at approximately 95° C. The relative speeds of the dryer drum and the wash drum imparted a relaxation of approximately 5.3% to the filaments, giving a total stretch of approximately 518. The dried filaments were then wound onto a tube onto a Leesona modified Model 959 winder.

The filaments were removed from the tube and cut into 2 to 3" lengths with scissors and placed in a ceramic sagger and then heat treated in a furnace by heating in air at a rate of 60° C. per hour to 1080° C., flushing with Argon for 20 minutes at a rate of 10 cubic ft. per hour, then flushing with hydrogen at a rate of 10 cubic feet per hour while heating at a rate of 85° C. per hour to 1230° C., changing the rate of hydrogen to 15–20 cubic ft. per hr. and "soaking" at 1230° C. for 2.5 hours. The fibers were then cooled at a rate of 100° C. per hour to 1000° C. with a lowering of the hydrogen flush rate to 10 cubuc feet per hour from 1230° to 1100° C. and then a further reduction to 5 cubic ft. per hr. at 1100° C. to 1000° C., where the cooling rate was changed to 60° C./hr. and cooled to 300° C. where the cooling rate was changed to 100° C./hr. and then cooled to ambient temperature.

Example 2

Production of a second conductive titanium oxide ceramic fiber

Following the procedure of Example 1, 0.75 grams of tin oxide ($SnO_2$) powder was used to introduce 1.5% by weight of tin oxide into 50 grams of $TiO_2$ (same as in Example 1). 33% by weight of water was added, and the mixture then mixed in a ball mill for twenty hours. After mixing, the powder was oven dried, calcined in air at 1400° C., reground, and returned to the process of Example 1 at the point of adding water containing 3 wt. % of D,L-1-amino-2-propanol dispersant Aldrich Chemical, catalog #11,024-8, to create a dispersion of ceramic powder in water for ball milling to eliminate or reduce agglomerates. The remaining procedures were identical to those described in Example 1, and the fibers produced and test results were comparable.

Example 3

Production of a third conductive titanium oxide ceramic fiber

Following the procedure of Example 2, 1.6 grams of niobium oxide were added to 50 grams of $TiO_2$ (from Diamond Metals, Japan, with a mean particle size of approximately 0.5 micrometers. The powders were mixed dry for 2 hours in a V-blender and then calcined in air for two hours at 1540° C., to create a slight oxygen deficiency (from stoichiometric $T_iO_2$), reground and returned to the process of Example 1 at the point of adding water containing 3% by weight of and about 2 ml of Triton® X-100 surfactant from Union Carbide Corporation to create a dispersion of ceramic powder in water for ball milling so as to eliminate/reduce agglomerates. Five drops of tri-butyl-phosphate were added to reduce foaming. Spinnerette size and firing parameters varied from Examples 1 and 2 as specified below, but, other than as specified below, the remainder of the procedures were identical to those described in Examples 1 and 2. The spinnerette contained 100 holes of 89 µm diameter each, which produced ceramic/cellulose mixture fibers 28 micrometers in diameter and sintered fibers 15 µm in diameter. Conductivity was created by reduction while sintering for one hour in hydrogen at 1215° C.

Example 4

Production of a lithium aluminate ceramic fiber 80 grams of deionized water were added to 50 grams of a mixture of 90% by weight of $LiAlO_2$ (obtained from Aldrich Chemical, having a mean particle size of approximately one micrometer and) 10% of $LiAlO_2$ (obtained from a confidential source) which comprised particles of submicron size. The combination was ball milled for sixteen hours to further reduce particle size and reduce/eliminate agglomerates. Approximately one milliliter of caustic soda (NaOH) was pipetted into the milled mixture to raise the pH into the 11.0 to 12.0 range. Approximately 119 cubic centimeters (132 grams) of viscose containing 9.45% by weight of cellulose was added to the suspension. This mixture was treated, through the deaeration step, according to the procedures described in Example 1. The stirred mixture then was filtered through 25–40 micrometers cloth under =10 psi air pressure, and then stored for two hours at 10° C.

The ceramic/viscose mixture then was fed into a spinning machine through an enclosed and air pressured chamber using a constant pressure, variable volume "Zenith" metering pump. The pump forced the precursor through a spinnerette containing 100 round, straight sided holes of 89 µm diameter into a 43° C. coagulation bath. The bath was flowing gently countercurrent to the discharging precursor, and was composed of 7.5% by weight of sulfuric acid ($H_2SO_4$), and 22.0% by weight of sodium sulfate ($Na_2SO_4$), with the remainder being deionized water. The viscose portion of the precursor precipitated and reacted with the spinbath to produce fibers of approximately 20% by weight of rayon and approximately 80% by weight of ceramic with approximately 10 µm diameter. Precursor was fed into the spin bath at a rate of approximately 16.0 grams per minute and the spun fiber was drawn away from the spinnerette face by a take-up godet operating at a linear speed of approximately 6.0 meters per minute.

The fibers were pulled from the first take-up godet by a second, faster paced godet, operating at a linear speed of approximately 7.0 meters per minute, thus applying a 17.5% extension to the fiber to align both the cellulose molecules and the ceramic particles along the longitudinal axis of the fiber. In their passage from first to second godet, the fibers were immersed in a boiling, deionized water bath containing a small amount, <1% by weight of $H_2SO_4$. This bath continued the regeneration started in the spinbath and began a cleansing/washing process. The fibers were wound continuously onto a take up reel moving at the same linear speed as the second godet.

The fibers were cut to lengths of about 6 inches and cleaned of sulfuric acid residue by dipping consecutively into two clean 95° C. water baths for approximately two minutes each, and allowed to dry for approximately 24 hours.

The dried fibers were sintered in air in a tube furnace. First, the fibers were pushed to the edge of the first heater in the furnace, where the temperature was approximately 400° C., where they remained for about five minutes until the rayon in the fiber burned off as carbon dioxide ($CO_2$) and water. Second, the fibers were pushed to the center of the heating zones of the furnace, where the temperature was about 1500° C., and allowed to remain for five minutes to sinter the ceramic particles. Third, the furnace temperature was then reduced to 900° C. for one hour to return the ceramic fibers to the $LiAlO_2$ gamma phase. Fourth, the fiber was pushed out of the hot zone into an area where the temperature was approximately 250° C. and allowed to cool gradually over another five minute period, Finally, the fibers were removed and allowed to cool gradually to ambient temperature.

Visual and microscopic inspection revealed distinct fibers which retained their individual character in mild handling. After firing, fiber length was broken to approximately ⅛ inch and the diameter was approximately 15 micrometers.

Example 5A (prophetic)

Production of a superconducting 1-2-3 YBCO ceramic fiber $YBa_2Cu_3O_7$ was fired in air for approximately fifteen hours at 960° C., cooled and refired in air at 920° C. for approximately two hours then heated to 1170° C. as rapidly as possible and held at this temperature for 15 to 20 minutes, then cooled at a rate of 10° C. per minute to approximately 1020° C., then slow cooled at 1°–2° C./hour in air to 960° C., then cooled at a rate of 10° C. per hour to approximately 880° C., then cooled at a rate of 6° C. per hour to approximately 400° C. and finally cooled at a rate of approximately 20° C. per hour to ambient temperature. The particles were ground to approximately 5 mm diameter and magnetically classified under cryogenic conditions (in liquid nitrogen) to select only the superconducting, high-purity components of the powder, and finally ground to =2 mm diameter in a mortar and pestle and again magnetically classified under cryogenic conditions (in liquid nitrogen) to select only the superconducting, high-purity components of the powder. The powder was then jet-pulverized to particles of average diameter of 1–2 μm. 100 parts of this jet-pulverized powder were added to a solution of 5.0 parts of the reaction product of 30 moles of ethylene oxide with castor oil (Alkamuls® EL-620 from Rhône-Poulenc Surfactants and Specialties), 5.0 parts of the reaction product of propylene oxide and ethylene oxide with p-phenyl phenol (Antarox® WA-1 from Rhône-Poulenc Surfactants and Specialties), 1.0 part of a 75% solution of sodium dioctyl sulfosuccinate (Geropon™ SS-O-75 from Rhône-Poulenc Surfactants and Specialties) and 1.0 part sodium hydroxide in 88.0 parts deionized water and agitated to form a suspension. This suspension immediately is pumped by metering pump into a stream of deaired viscose as in Example 1A, pumped by a Zenith® pump as in Example 1A, both flows metered so as to give a weight ratio of 80 parts of the superconductive powder to 20 parts of cellulose. The mixture immediately goes through an in-line static tube or pipe mixer to form a homogeneous spin mix and then through a spinneret and through other viscose rayon processing as in Example 1A. The resulting fiber is then sintered in air by heating at a rate of 100° C./hr. to 960° C., holding at this temperature for 5 minutes and then cooling at a rate of 25° C./hr. to 900° C. Oxygen is then added at a rate of 10 cubic feet per minute and the cooling is continued at a rate of 25° C./hr. to 800° C. The fiber is then annealed by changing the cooling rate to 4° C./hr. to 400° C. and then to 25° C./hr. to 200° C. and then to 100° C./hr. to ambient temperature.

Example 5B (prophetic)

Production of a superconducting 1-2-3 YBCO ceramic fiber

Example 5A is repeated except that the deaerated viscose is metered into the stream of the superconductor dispersion.

Example 5C (Prophetic)

Production of a superconducting 1-2-3 YBCO ceramic fiber

Example 5A is repeated except that Isoton® II, a solution of 0.793% sodium chloride, 0.038% disodium EDTA (ethylenediaminetetraacetic acid), 0.040% potassium chloride, 0.019% sodium dihydrogen phosphate, 0.195% disodium phosphate and 0.030% sodium fluoride, all by weight in distilled water from Coulter Corporation is used in place of deionized water.

Example 5D (Prophetic)

Production of a superconducting 1-2-3 YBCO ceramic fiber

Example 5A is repeated except that a 5% sodium chloride on the weight of the superconductor is added to the distilled water-dispersant combination.

Example 5E (Prophetic)

Production of a superconducting 1-2-3 YBCO ceramic fiber

Example 5D is repeated except that sodium chloride is replaced by sodium sulfate.

Example 5E1

5.0 grams of the superconductor powder from Example 5A was added to 5.0 grams of deionized water and dispersed with agitation. 13.2 grams of viscose as in Example 1A was added to this dispersion and mixed by hand with a spatula. The mixture gelled before it could be mixed completely.

This procedure was repeated except that the superconductor was added to a solution composed of 4.41 grams of deionized water, 0.1 grams of Alkamuls EL-620, 0.1 grams of Antarox WA-1, 0.15 grams of Geropon SS-O-75, and 0.24 grams of the components of Isoton II solution as described in Example 5C. The mixture with viscose was fluid without gelation at ambient temperature for approximately 58 minutes.

Example 5E2

Example 5E1 was repeated except that the superconductor was added to a solution composed of 4.275 grams of deionized water, 0.1 grams of Alkamuls EL-620, 0.1 grams of Antarox WA-1, 0.15 grams of Geropon SS-0-75, and 0.125 grams of NaCl. The mixture with viscose was fluid without gelation at ambient temperature for approximately 92 minutes.

Example 5E3

Example 5E2 was repeated except that the supercondutor was added to a solution composed of 3.93 grams of deionized water, 0.1 grams of Alkamuls EL-620, 0.1 grams, of AntaroxWA-1, 0.15 grams of Geropon SS-0-75, and 0.72 grams ofCheelox 354, which is a 36% aqueous solution of sodium glucoheptonate from Rhône-Poulenc Surfactants and Specialties. The mixture with viscose was fluid without gelation at ambient temperature for approximately 77 minutes.

Example 5E4

Example 5E2 was repeated except that the superconductor was added to a solution composed of 4.41 grams of deionized water, 0.1 grams of Alkamuls EL-620, 0.1 grams of AntaroxWA-1, 0.15 grams of Geropon SS-0-75, and 0.24 grams of sodium borate hydrate ($Na_2B_4O_7 \cdot 10H_2O$). The mixture with viscose was fluid without gelation at ambient temperature for approximately 72 minutes.

Example 5E5

50.0 grams of the superconductor powder from Example 5A was added to a solution composed of 44.1 grams of deionized water, 1.0 grams of Alkamuls EL-620, 1.0 grams of Antarox WA-1, 1.5 grams of Geropon SS-0-75, and 2.4 grams of NaCl. 132.3 grams of viscose as in Example IA was added to this dispersion and mixed by hand with a spatula. The fluid mixture was deareated under vacuum for 5 to 10 minutes. The mixture was fluid for approximately two hours or longer at ambient temperature.

Example 5E6

10.0 grams of the superconductor powder from Example 5A was added to a solution composed of 8.8 grams of deionized water, 0.2 grams of Alkamuls EL-620, 0.2 grams of Antarox WA-1, 0.3 grams of Geropon SS-0-75, and 0.5 grams of NaCl and mixed by hand to form a dispersion of the superconductor powder. 26.5 grams of viscose as in Example IA at a salt index of approximately 6 was added to this dispersion and mixed by hand with a spatula. The mixture was fluid for approximately 80 minutes at ambient temperature of approximately 30 decrees Celsius.

Example 5E7

Example 5E6 was repeated except the viscose had a salt index of 10 and had not gone through the usual viscose ripening process. The mixture was fluid for approximately 15 minutes at ambient temperature of approximately 30 degrees Celsius.

Example 5N-1

Production of a superconducting 1-2-3 YBCO ceramic fiber 75 grams of a mixture by weight of 15.1% yttrium oxide ($Y_2O_3$), 52.9% barium carbonate ($Ba(CO_3)_2$) and 32.0% cupric oxide (CuO) were mixed by first blending the proper amounts of $Y_2O_3$ and CuO in a V-blender for 1 hr., adding the $BaCO_{32}$ and blending for an additional two hours, was added to a solution of 4.5 grams of a 25 wt. % of the sodium salt of an acrylic copolymer (Colloid™ 111 from Rhône-Poulenc Surfactants and Specialties) and 61.5 grams of deionized water as in Example 1A and milled overnight as in Example 1A. After adding 5.0 grams of 1N NaOH and 4.0 grams of deionized water to the dispersion, it was mixed with a viscose of the same composition deaired and spun into fiber in the same manner as in Example 1A. The spinbath composition was by weight 7.5% $H_2SO_4$, 22.0% $Na_2SO_4$, and 2.5% $ZnSO_4$ at a temperature of about 45 degrees Celsius and a hot second bath of approximately 2.0% $H_2SO_4$. A small amount of fiber was obtained to be converted to a superconductive fiber.

Example 5N-2

Production of a superconducting 1-2-3 YBCO ceramic fiber

Example 5N-1 was repeated except the spinneret used was a single hole assembly of approximately 3 mm diameter. The spin mix was fed by gravity to the spinneret and into the spinbath. About 4 feet of the monofilament was obtained to be converted to a superconductive fiber.

Example 5O (Coating of a superconductor 1-2-3 YBCO powder)

The superconducting powder from Example 5A was coated by suspending 25.0 grams of the powder in a mixture of 40.0 grams of Morprime 10B from Morton International, a 15 weight percent an organosol type modified polypropylene dispersion in a high boiling aliphatic solvent and 1.6 grams of Eastman PA-6 plasticizer Eastman Chemical. The uniform suspension was left in an open beaker for two days and then poured onto a watch glass on a hot plate to evaporate the high boiling solvent at approximately 150° C. and to form a film around the superconductor particles. 15 grams of this dry coated powder were added to 15 grams of deionized water containing 0.6 grams Geropon SS-0-75, 0.4 grams of Alkamuls EL-620 nd 0.4 grams of Antarox WA-1 dispersants and milled with 24 zirconia media in a small plastic jar for 40 minutes. Addition of 10.0 grams of deionized water to the thick grease that resulted gave a good fluid dispersion. 20.5 grams of viscose as in Example 5E1 was added to 31.0 grams of this dispersion and mixed by hand with a spatula to give a fluid mixture which was fluid for over one hour and still fluid after freezing overnight and thawing. This spin mix can be converted into a superconductive fiber by the general procedure of Example 1A or 5A or B.

Example 5P (Coating of a superconducting 1-2-3 YBCO powder)

The superconductor precursor powder from Example 5N-1 was converted to YBCO superconductor by a three-step heating process in which the first step was 860° C. for 30 hours, the second step 900° C. for 15 hours and the third step, 920° C. degrees C. for 15 hours and then 950° C. for 15 hours. This superconductor powder was seived to approximately 41 micrometers particle size and then coated by suspending 10.0 grams of the powder in a mixture of 4.7 grams of Morprime 10B, 0.4 grams of Eastman PA-6 plasticizer and 5.0 grams of toluene. The uniform suspension was rapidly heated, in an open crystallizing dish to approximately 150° C.–160° C. to evaporate the solvent and to form a film around the superconductor particles. 5.0 grams of this dry coated powder was added to 5.0 grams of deionized water containing 0.3 grams Geropon SS-0-75, 0.2 grams of Alkamuls EL-620 and 0.2 grams of Antarox WA-1 dispersants and dispersed with hand agitation. 13.2 grams of viscose as in Example 5E1 was added to this dispersion and mixed by hand with a spatula to give a mix which was fluid for over one hour. This spin mix can be converted to a superconductive fiber by the general procedure of Example 1A or 5A or B.

Example 5P-2

Coating of a superconducting 1-2-3 YBCO powder The superconductor precursor powder from Example 5A was coated by suspending 100.0 grams of the powder in a mixture of 3.0 grams of a 50 weight percent solution in xylene of chlorinated maleated polypropylene (Eastman CPE-343-1), 0.8 grams of Eastman PA-6 plasticizer and 91.2 grams of xylene. The uniform solution was rapidly heated, with frequent stirring and agitation, in an open crystallizing dish on a hot plate to evaporate the solvent and to form a film around the superconductor particles. 5.0 grams of this dry coated powder was added to 5.0 grams of deionized water containing 0.15 grams Geropon SS-0-75, 0.2 grams of Igepal DAP-9 and dispersed with hand agitation. 13.2 grams of viscose as in Example 5E1 was added to this dispersion and mixed by hand with a spatula to give a mix which was fluid for about 225 minutes. This spin mix can be converted by the procedure of Example 1A or 5A or B.

Example 5P-3

Coating of a superconducting 1-2-3 YBCO powder Example 5P-2 was repeated except the 5.0 grams of the aqueous solution of dispersants contained 0.25 grams of sodium chloride, added after the dispersants were dissolved in the water, before the coated superconductor powder was added. 13.2 grams of viscose as in Example 5E1 was added to this dispersion and mixed by hand with a spatula to give a mix which was fluid for over 225 minutes. This spin mix can be converted by the procedure of Example 1A or 5A or B.

Example 5P-4

Coating of a superconducting 1-2-3 YBCO powder 29.2 grams of Morprime™ 14B, from Morton International, Inc., was added to 34.0 grams of Isopar M, from Exxon Chemicals Americas, in a 41/2×2" preparation dish and heated on a hot-plate to over 100° C. to obtain a uniform solution. Morprime 14B is decribed as a 12.0+/−1.0% solids organosol type formulated polypropylene dispersion in Isopar M solvent, Isopar M solvent is described as a synthetic isoparaffinic hydrocarbon solvent with a boiling point of 354° to 372° F. Morprime 14B is 12.0+/−1.08 solids. 1.8 grams of Eastman® PA-6 adhesive plasticizer, described as a mixture of 80% Di(2-Ethylhexyl) Terephthalate (DOTP) and 20% Poly(2,2,4-Trimethyl-1, 3-Pentanediol Maleate)), from Eastman Chemical Company, dissolved in 5.0 grams of xylene was added to this hot solution, mixed and reheated to form a uniform cloudy solution. 70.0 grams of the superconductor precursor powder from Example 5E-6 was added to this hot solution and stirred by hand with a spatula to form a uniform dispersion. This dispersion was heated on a hot plate, with intermittent stirring, at about 150° to 160° C. to remove the xylene and Isopar M solvents to leave a soft powder that was not wet by water.

25.0 grams of this coated powder was added to 25.0 grams of a saline dispersant solution made by adding 42.0 grams of deionized water to 1.5 grams of Surfynol TG, described as a mixture of 2,4,7,9-tetramethyl-5-decyne-9,7-diol, 1,2-ethanediol, and a trade secret ingredient and 2.0 grams of Igepal® DAP-9, described as ethoxylated (9–10 moles of ethylene oxide) diamyl phenol. This mixture was milled in a small plastic jar using zirconia media for approximately one hour. 163.7 grams of a viscose as in Example 1A was added to 46.4 grams of the coated superconductor powder and mixed thoroughly with a spatula to form a uniform spin mix of a 60:40 ratio of coated superconductor to cellulose. This spin mix was filtered under vacuum through filter paper of 20 to 25 $\mu$m, deaerated under vacuum for about 10 minutes to remove air and spun through a 100 hole conventional rayon spinneret as in Example 1A at a pump speed of 16 grams per minute. The spinbath contained approx. 7.5% sulfuric acid, 22.0% sodium sulfate and 1.5% zinc sulfate, all by weight, at 95° C. The first godet speed was 39.2 RPM (linear speed of approx. 6.0 meters per minute) while the second godet speed was 51.6 rpm (linear speed of approx. 7.9 meters per minute), resulting in a stretch of approximately 32%. The second bath contained approximately 2% by weight sulfuric acid at a temperature of approximately 95° C. The resulting filaments were wound on a winder as in Example 1A at the same linear speed of the second godet. The filaments were then cut off of the tube into 6 inch lengths and washed two times by hand in a large beaker of deionized water at approximately 95° C. and air dried. The dried fibers had retained the black color of the original superconductor powder. These fibers can now be sintered to yield superconductor fibers.

Example 5Q

Example 5P was repeated except the superconductor powder used in Example 5A was used and only 2.0 grams of toluene was added to the coating dispersion. Essentially the same results were obtained.

Example 5R

Example 5P was repeated except that 0.3 grams of Alkamuls EL-620 and only 2.0 grams of toluene were added to the coating dispersion. A softer, less aglomerated powder was obtained.

Example 6

Production of a lead-zirconia-titanate (PZT) ceramic fiber 45 grams of deionized water containing 2 ml of Triton X-100 surfactant were added to 45 grams of lead-zirconia-titanate (PZT) powder. To the mixture was added approximately 41 cubic centimeters (47 grams) of viscose, containing 9.45% by weight of cellulose. This mixture was stirred for one-half hour with a high shear mixer to mix the components, to break up agglomerates and to further eliminate agglomerates. The stirred mixture then was filtered through 25–40 micrometers cloth under =10 psi air pressure, and the mixture was then stored for one hour at 10° C. to deaerate, and allowed to equilibrate at 18° C. for 30 minutes prior to spinning.

The ceramic/viscose mixture then was fed into a spinning machine through a constant pressure, variable volume "Zenith" metering pump. The pump forced the precursor through a viscose rayon spinnerette containing 350 round holes of 64 $\mu$m diameter into a 53° C. spinbath, flowing gently countercurrent to the direction as the discharging precursor, and composed of 7.5% by weight of sulfuric acid ($H_2SO_4$), and 22.0% by weight of sodium sulfate ($Na_2SO_4$), with the remainder being deionized water. The viscose portion of the precursor precipitated the mixture into fibers and reacted with the acid in the spinbath and to give fibers of 10% by weight of rayon and 90% by weight of ceramic having diameters of approximately 35 $\mu$m. Precursor was fed into the spin bath at a rate of approximately 20.0 grams per minute and the spun fiber drawn away from the spinnerette face by a take-up godet operating at a linear speed of approximately 6.2 meters per minute.

The fibers were pulled from the first take-up godet by a second, faster paced godet, operating at a linear speed of approximately 7.0 meters per minute, which applied a 12.9% extension to the fiber to align both the cellulose molecules and the ceramic particles along the longitudinal axis of the fiber. In its passage from first to second godet, the fiber was immersed in a boiling deionized water bath containing a low concentration (<1% by weight) of $H_2SO_4$. This bath continued the regeneration reaction started in the coagulating bath and began the cleansing/washing process. The fibers were wound continuously on a take up reel moving at the same linear speed as the second godet.

The fibers were removed from the take up reel in a continuous >50 meter length and cleaned of sulfuric acid residue by dipping the fibers consecutively into at least two clean 95° C. water baths for two minutes each. The fibers were then allowed to air dry for approximately 24 hours.

Visual and microscopic inspection revealed distinct fibers which retained their individual character in mild handling. The fibers retained continuous form. Fiber diameter was approximately 45 micrometers, and strength appeared to be approximately 140 MPa as measured by the bending test method.

The fibers were sintered in a lead controlled atmosphere hearing initially at 1° C./min to 550° C. and holding for 3 hours. The fibers were then heated at 3.5° C./min to 1285° C. and held for one hour.

Example 6A

Production of a lead-zirconate-titanate (PZT) ceramic fiber 100 grams of lead-zirconate-titanate Pb(Zr,Ti)$O_3$ (PZT) powder, burned out at 500° C., was added to 100 grams of deionized water and milled overnight as in Example 1A except that the weight ratio of inorganic compound to cellulose was 80:20. The next day, this PZT dispersion was mixed with viscose and spun into fiber as in Example 1A. The maximum stretch obtained through a 3% $H_2SO_4$ second bath at a temperature of approximately 95° C. was 37% at 53 RPM. The continuous filament fiber was then washed in a continuous length through a large crystallizing dish containing deionized water at approximately 95° C. and then dried at ambient temperature for two hours.

Example 6B

Production of a lead-zirconia-titanate (PZT) ceramic fiber 250 grams of lead-zirconia-titanate (Pb,Zr,TiO3) tPZT-5H from Morgan-Matroc, England) powder was added to 250 grams of deionized water and milled in a porcelain jar with 35–50 mixed size alumina media for about 24 hours. The next day, 12 grams of 1N˜HaOH was added to 238 grams of this PZT dispersion and this mixture was mixed with viscose as in Example 6A except that the weight ratio of PZT to cellulose was 90:10. The filtered and deaired viscose was frozen overnight, thawed and converted into fiber as in Example 1E, except that the pump speed was 45 grams per minute, the spinbath temperature was approximately 45° C. with a composition of approximately 7.04 wt. % H2SOqr 21.95 wt. % Na2SO4 and 2.04 wt. % ZnSO4. The godet speed was aprox. 13.6 rpm. The second bath contained approximately 5 wt. % H2SO4 with a temperature of approximately 85° C. The wash drum speed was 14.3 rpm with a water temperature of approx. 60° C. The dryer drum speed was 17.7 RPM. The relative speeds of the dryer drum and the wash drum gave no relaxation to the filaments, giving a total stretch of approximately 40⁻. The dried filaments were then wound onto a tube onto a Leesona modified Model 959 winder.

Example 7

Production of a molybdenum disilicide ceramic fiber 40 grams of $MoSi_2$ powder were ball milled for 16 hours in 40 grams of deionized water containing 3% by weight of 2amino-1-propanol to reduce particle size, and then pipetted with about 1 ml of 1.0N NaOH to a pH of 11–12. To this mixture was added approximately 90 cubic centimeters (106 grams) of viscose containing 9.45% by weight of cellulose. This mixture was stirred for twenty minutes under high shear to further eliminate agglomerates. The stirred mixture then was filtered through 25–40 μm cloth under =10 psi air pressure, deaerated and then equilibrated at 18° C. as described in Example 6.

The ceramic/viscose mixture was fed into a spinning machine through a constant pressure, variable volume "Zenith®" metering pump. The pump forced the precursor through a spinnerette containing 350 round, holes of 64 μm diameter into a 47° C. coagulation bath, flowing gently in the same direction as the discharging precursor, composed of 7.5% by weight of sulfuric acid ($H_2SO_4$), and 22.0% by weight of sodium sulfate ($Na_2SO_4$), with the remainder being deionized water. The viscose portion of the precursor reacted with the coagulating bath acid and precipitated the mixture into fibers of 20% by weight of rayon and 80% by weight of ceramic having approximately 40 mm diameters. Precursor was fed into the spin bath at a rate of approximately 21.0 grams per minute and the spun fiber drawn away from the spinnerette face by a take-up godet operating at a linear speed of approximately 6.1 meters per minute.

The fibers were pulled from the first take-up godet by a second, faster paced godet, operating at a linear speed of approximately 7.5 meters per minute, which applied a 22.9% extension to the fiber to align both the cellulose molecules and the ceramic particles along the longitudinal axis of the fiber. In its passage from first to second godet, the fiber was immersed in a boiling water bath containing $H_2SO_4$ in a concentration of <1% by weight. This bath continued the regeneration started in the coagulating bath and began a cleansing/washing process. The fibers were wound continuously on a take up reel moving at the same linear speed as the second godet.

The fibers were cleaned of any sulfuric acid residue by dipping the fibers, still on the take up reel, into two consecutive clean water 95° C. baths for two minutes each. The fibers were removed continuously from the take up reel and air dried for approximately 24 hours.

The continuous, dried fibers were sintered in an atmospherically controlled furnace in two distinct stages. First, the fibers were prefired in argon at 800° C. to drive off the rayon. Then the temperature gradually was raised (100° C./hour) to 1800° C. and the fiber allowed to remain at that temperature for one minute. Thereafter, the furnace was naturally cooled to ambient temperature in argon and the fibers removed.

Visual and microscopic inspection revealed distinct fibers which retained their individual character in mild handling. Continuous length was retained after firing with individual fiber diameter of approximately 11 mm.

Example 8

Production of a fourth conductive titanium oxide ceramic fiber

Following the procedure of Example 7, 30 grams of titania, reduced in hydrogen to $Ti_4O_7$, were reground to approximately 10 micrometers particle size, and mixed with 30 grams of deionized water and titrated with 1.0N NaOH to a pH of 11–12. To the mixture was added approximately 71.5 cubic centimeters (80 grams) of viscose, containing 9.45% by weight of cellulose. This mixture was stirred for ten minutes with mixing speed deliberately low to avoid excessive agitation and addition of excess air. The stirred mixture then was filtered through 25–40 micrometers cloth under =10 psi air pressure. The filtered mixture was then deaerated and equilibrated at 18° C. as described in Example 6.

The ceramic/viscose mixture was fed into a spinning machine through a constant pressure, variable volume "Zenith" metering pump. The pump forced the precursor through a spinnerette containing 100 round holes of 89 μm diameter into a 45° C. coagulation bath, flowing gently in the opposite direction as the discharging precursor, and composed of 8.0% by weight of sulfuric acid ($H_2SO_4$), and 22.0% by weight of sodium sulfate ($Na_2SO_4$), with the remainder being deionized water. The viscose portion of the precursor reacted with the coagulating bath acid and precipitated the mixture into fibers of 50% by weight of rayon and 50% by weight of ceramic with approximately 60 micrometers diameter. Precursor was fed into the spin bath at a rate of approximately 15.0 grams per minute and the spun fiber drawn away from the spinnerette face by a take-up godet operating at a linear speed of approximately 6.0 meters per minute.

The fibers were pulled from the first take-up godet by a second, faster paced godet, operating at a linear speed of approximately 7.0 meters per minute, which applied a 16.7% extension to the fiber to align both the cellulose molecules and the ceramic particles along the longitudinal axis of the fiber. In its passage from first to second godet, the fiber was immersed in a near boiling deionized water bath. This bath completed the precipitation reaction (continued the regeneration) started in the coagulating bath and began the cleansing/washing process. The fibers were wound continuously onto a take up reel moving at the same linear speed as the second godet.

The fibers were cleaned of sulfuric acid residue by dipping the fibers, still on the take up reel, consecutively into two clean 95° C. water baths for two minutes each. The fibers were removed from the take up reel in a continuous >50 meter length and allowed to air dry for approximately 24 hours.

The continuous, dried fibers were slowly heated in air in a furnace to a temperature of about 280° C. and maintained at that temperature for about thirty minutes until the rayon in the fiber burned off as carbon dioxide ($CO_2$) and water. The temperature was again increased. At about 300° C., the furnace air was evacuated and hydrogen introduced into the furnace, while the heating continued to slowly increase the temperature to 1175° C. Temperature was maintained for 30 minutes to sinter the reduced ceramic particles. Then, the fibers were cooled gradually to ambient temperature, maintaining the hydrogen atmosphere until the temperature was reduced to below 300° C.

Visual and microscopic inspection revealed distinct fibers which retained their individual character in mild handling. After firing, the fiber retained continuous form, fiber diameter was approximately 10 micrometers, and strength appears to be approximately 180 MPa as measured by the bending test method.

Example 9

Production of a conductive tin oxide ceramic fiber 80.0 grams of a mixture of approximately 90:10 by weight of stannic oxide ($SnO_2$) and antimony oxide ($Sb_2O_3$) (Stanostat CP15G from Magnesium Elektron Industries) added to 80.0 grams of deionized water and milled overnight in a plastic jar. The next day, the very thick dispersion was thinned by adding 2 ml of sodium silicate solution (Aldrich Chemical Catalog #1344-09-8, ~27% $SiO_2$ & 14% NaOH) and milling for an additional 1 hour. After adding 2.0 grams of 1N NaOH solution, the thin dispersion was mixed with the same type of viscose to give a ratio of approximately 70:30 by weight of inorganic compound to cellulose, deareated and converted into fiber in the same manner as in Example 1A. The spinbath was composed of approximately 7.5% $H_2SO_4$, 22.0% $Na_2SO_4$, and 2.5% $ZnSO_4$ by weight at a temperature of about 45 degrees Celsius and a hot second bath of approximately 2.0% $H_2SO_4$. A maximum stretch of 70% was achieved. The collected fiber was purified as in Example 1A. Further purification was done by dipping in approximately 1% NaOH solution, deionized water two times, 2.5% acetic acid solution, then deionized water three times was needed.

Example 9A

Production of a conductive tin oxide ceramic fiber 210.0 grams of a mixture of approximately 90:10 by weight of stannic oxide ($SnO_2$) and antimony oxide ($Sb_2O_3$) (Stanostat CP15G from Magnesium Elektron Industries) was added to a solution of 12.6 grams of a 30% aqueous solution of sodium polymethacrylate of an average molecular weight of about 10,000(Colloid™ 225 from Rhône-Poulenc Surfactants and Specialties), and 12.6 grams of sodium silicate solution (Aldrich Chemical Catalog #1344-09-8, 27% $SiO_2$ & 14% NaOH) in 184.8 grams of deionized water and milled overnight in a plastic jar. The mixture was very thick when it was added to the mill and was still thick, but uniform and thinner the next day. After adding 5.0 grams of 1N NaOH solution, the dispersion was mixed with the same type of viscose at the same ratio as in Example 9 and deareated in the same manner as in Example 1A. The spin mix was converted into fiber as in Example 1A except the immersion of the filaments in the spinbath was approximately 40 cm. and the spinbath, which was composed of approximately 7.5% $H_2SO_4$, 22.0% $Na_2SO_4$, and 2.5% $ZnSO_4$ by weight at a temperature of about 45 degrees Celsius had a volume of approximately 20 liters, replenished from a reservoir of approximately 20 gallons with a flow of about 1 gallon per minute countercurrent to the direction of the filaments. The filaments emerged from the spinbath and were wrapped three times around two godets of 0.628 meters circumference each, both rotating clockwise at 24.6 RPM and then into a hot second bath of approximately 4.0% $H_2SO_4$ solution at approximately 90° C. with an immersion length of approximately 25 cm. The filaments emerged from this hot second bath and were wrapped approximately 26 times around a wash drum of approximately 0.840 meters circumference rotating clockwise at a speed of approximately 27.6 RPM to give a godet stretch of approximately 50%. While around this drum, the filaments were washed with deionized water at approximately 57° C. falling on the filaments from holes in two tubes suspended above the wash drum. The filaments then left the wash drum to be wrapped about 15 times around a heated dryer drum of 0.678 meters circumference rotating clockwise at a speed of approximately 33.2 RPM at approximately 105° C. The relative speeds of the dryer drum and the wash drum imparted a relaxation of approximately 3% to the filaments. The dried filaments were then wound onto a tube onto a modified Leesona Model 959 winder.

Example 9B

Production of a conductive tin oxide ceramic fiber 225.0 grams of Stanostat CP15G was added to a solution of 13.5 grams of sodium silicate solution (Fisher Scientific Catalog #SS338-1) and 136.5 grams of deionized water and milled overnight in a plastic jar. The next day, 75.0 grams of deionized water was added to the thick dispersion and the mixture was milled an additional one hour. Then, 15.0 grams of 1N NaOH solution was added to this dispersion and 952.9 grams of the high strength, wet modulus viscose in Example 1E was added to give a weight ratio of powder to cellulose of 75:25. This spin mix was filtered, deareated frozen overnight, thawed and converted into fiber as in Example 1E except the pump speed was 8 grams per minute and a 100 round 88.9 um hole conventional rayon spinneret was used The spinbath was approx. 4.21% H2SO4, 13.6% Na2SO4, and 4.32% ZnSO4 by weight at a temperature of about 35° C. The first godet speed was 8.8 rpm and the second bath contained 2% by weight sulfuric acid at approx. 65° C. The wash drum speed was approx. 10.5 rpm with a water temperature of approx. 65° C. The dryer drum speed was approx. 12.6 rpm at a surface temperature of approx. 95° C. The relative speeds of the dryer drum and the wash drum imparted a relaxation of approx. 3% to the filaments with a total stretch of approx. 54%. The dried filaments were then wound onto a tube onto a Leesona modified Model 959 winder.

While the invention has been shown and described with particular reference to specific embodiments thereof in the interest of complete definiteness, it will be understood that it may be embodied in other forms diverse from those specifically shown and described, without departing from the scope of the invention as defined by the appended claims.

What is claimed is:

1. A process of producing at least one filament of refractory material, comprising:

preparing a dispersion of particles of refractory material;
preparing a spin mix by mixing said dispersion with a carrier solution comprising a salt of cellulose xanthate, wherein the weight ratio of said particles to cellulose of said cellulose xanthate in said spin mix is greater than about 2:8;

wet spinning said spin mix to form at least one filament of cellulose having at least a portion of said particles dispersed therein;

heating said at least one filament to sufficient temperatures and over sufficient durations to remove substantially all of said regenerated cellulose and to sinter said refractory particles to thereby form said at least one filament of refractory material.

2. The process of claim 1, wherein a portion of said particles are low-reactivity particles selected from the group consisting of particles at least in part coated with an organic barrier, particles combined with an inorganic compound, and combinations thereof.

3. The process of claim 2, wherein said organic barrier is a material selected from the group consisting of ethylene, propylene, olefin and diene homopolymers and copolymers, olefin and diene homopolymers and copolymers having functional groups, hydrocarbon waxes, fluorocarbon polymers including polytetrafluoroethylene, polyvinylidene fluoride, perfluorinated acrylates and methacrylates, urethanes, polyamides, polyurethanes, polyesters, polyethers, polyvinyl chloride, and acrylate and methacrylate ester homo and copolymers.

4. The process of claim 3, wherein said dispersion contains a low-reactivity dispersion medium selected from the group consisting of an aqueous salt, a chelant solution, a non-aqueous medium, and combinations thereof.

5. The process of claim 1, wherein said refractory material is a ceramic material.

6. The process of claim 5, wherein said ceramic material is a precursor for a superconductive ceramic.

7. The process of claim 6, which further includes the step of magnetically classifying said particles under cryogenic conditions prior to preparing said spin mix.

8. The process of claim 5, wherein a portion of said refractory material is selected from the group consisting of silicon carbide, aluminum nitride, silicon nitride, aluminum oxide, tin oxide, titanium carbide, hafnium oxide, zirconium oxide, titanium dioxide, molybdenum disilicide, lithium aluminate, ferrite, PZT (lead zirconium titanate), and antimony oxide.

9. The process of claim 5, wherein said refractory material is a powdered, electrically conductive substoichiometric titanium dioxide having uniformly distributed within its molecular structure chemically combined metal selected from the group consisting of chromium, copper, nickel, platinum, tantalum, zinc, magnesium, ruthenium, iridium, niobium, vanadium, tin, and combinations thereof.

10. The process of claim 5, wherein said refractory material particles are powdered, electrically conductive substoichiometric titanium dioxide having the basic formula $TiO_x$ wherein x is a number in the region of about 1.10 to about 1.95.

11. The process of claim 10, wherein said substoichiometric titanium dioxide has an electrocatalytically active surface on at least part of the surface of the titanium oxide.

12. The process of claim 11, wherein said electrocatalytically active surface includes a material selected from the group consisting of platinum group metals or alloys, platinum group metal oxides, lead and lead dioxide.

13. The process of claim 10, wherein said x is about 1.65 to about 1.9.

14. The process of claim 13, wherein said x is about 1.7 to about 1.8.

15. The process of claim 1 wherein said at least one filament of refractory material has one or more defined properties selected from current carrying capacity, range of physical or mechanical properties, electrochemical properties, electrorestrictive properties or other properties which are substantially the same as the corresponding properties of said refractory material from which said at least one filament is prepared.

16. The process of claim 1, wherein said particles comprises particles each having a maximum dimension of from less than 1 to about 5 microns.

17. The process of claim 1, wherein said dispersion contains a low-reactivity dispersion medium selected from the group consisting of an aqueous salt, a chelant solution, a non-aqueous medium, and combinations thereof.

18. The process of claim 1, wherein said dispersion contains a dispersant.

19. The process of claim 1, wherein said dispersion contains a modifier.

20. The process of claim 1, wherein said weight ratio of said particles to said cellulose in said spin mix is greater than 1:1.

21. The process of claim 20, wherein said weight ratio of said particles to said cellulose in said spin mix is greater than 7:3.

22. The process of claim 21, wherein said weight ratio of said particles to said cellulose in said spin mix is greater than 8:2.

23. The process of claim 1, wherein said spin mix is formed immediately before spinning such that contact time between said particles and said carrier solution is minimized.

24. The process of claim 1, wherein a portion of said carrier solution is a low-reactivity carrier solution selected from the group consisting of a carrier solution with substantially no excess hydroxide, a carrier solution with said salt of a cellulose xanthate dispersed in a non-aqueous medirboxmethylcellulose, hydroxyethyl cellulose, methyl cellulose, and combinations thereof.

25. The process of claim 1, wherein said spin mix contains a modifier.

26. The process of claim 25, wherein at least one modifier is selected from the group consisting of 1-amino-2-propanol and its isomers, polyethylene glycol, aminoalcohols including triethanolamine, diethanolamine, monoethanolamine, ethoxylated and/or propoxylated amines, aminomorpholine, aminophenol, aminopropanediol, aminomethyl propanol, aminomethylpropanediol, diethylethanolamine, amino pyridine, 2-(2-aminoethylanino)ethanol, (2-(2-aminoethoxy) ethanol, aminoethylpropanediamine, aminomethylbutanol, aminocarboxylic, sulfuric, sulfonic and phosphoric acids, di-, tri- and tetra-amines, polyamines, copolymers of ethylene oxide and propylene oxide, polypropylene glycol and propylene oxide and alkylene oxide adducts, and combinations thereof.

27. The process of claim 25, wherein said modifier is a combination of 1-amino-2-propanol and polyethylene glycol with a molecular weight of from about 1300 to about 1600 in ratios of about 90:10 to about 10:90.

28. The process of claim 27, wherein said modifier is a combination of 1-amino-2-propanol and polyethylene glycol with a molecular weight of approximately 1500 in ratios of about 75:25 to about 25:75.

29. The process of claim 25, wherein said modifier is an amine that also serves as a dispersing agent.

30. The process of claim 25, wherein said modifier is a polyethylene glycol having a molecular weight of about 1300 to about 1600.

31. The process of claim 25, wherein said spin mix is frozen for a certain duration before spinning.

32. The process of claim 25, wherein the content of said modifier is about 2% to about 10% by weight of cellulose in said carrier solution.

33. The process of claim 32, wherein the content of said modifier is about 4% to about 8% by weight of cellulose is said carrier solution.

34. The process of claim 25, wherein the content of said modifier is above about 2.5% by weight of cellulose in said carrier solution.

35. The process of claim 1, wherein said wet spinning step utilizes a spin bath containing zinc sulfate.

36. The process of claim 1, wherein said spin mix ages from about one hour to about 72 hours before spinning.

37. The process of claim 1, wherein said carrier solution comprises sodium cellulose xanthate.

38. The process of claim 37, wherein said carrier solution contains an excess of a strong base.

39. The process of claim 38, wherein said strong base is NaOH.

40. The process of claim 1, wherein said spinneret contains from 1 to about 20,000 holes each having a diameter of from about 18 to about 400 microns.

41. The process of claim 1, wherein said spin mix is spun into an acidic bath.

42. The process of claim 41, wherein said bath contains an inorganic acid.

43. The process of claim 42, wherein said inorganic acid is selected from the group consisting of sulfuric acid, hydrochloric acid, and phosphoric acid.

44. The process of claim 41, wherein said bath contains an inorganic salt derived from a strong base and a strong acid.

45. The process of claim 44, wherein said salt is selected from sodium sulfate, ammonium sulfate and potassium sulfate.

46. The process of claim 1, wherein said heating of said at least one filament to drive off said carrier is conducted in an oxygen-containing environment at a temperature of from about 200° C. to about 600° C.

47. The process of claim 46, wherein said sintering of said refractory particles is conducted in a furnace at a temperature of from about 750° C. to about 2200° C.

48. The process of claim 46, wherein said sintering of said refractory particles is conducted under a hydrogen atmosphere.

* * * * *